US010847758B2

(12) United States Patent
Kishimoto et al.

(10) Patent No.: US 10,847,758 B2
(45) Date of Patent: Nov. 24, 2020

(54) METHOD FOR RELEASING RESIN FILM AND METHOD FOR MANUFACTURING ORGANIC EL DISPLAY DEVICE

(71) Applicant: HON HAI PRECISION INDUSTRY CO., LTD., New Taipei (TW)

(72) Inventors: Katsuhiko Kishimoto, Osaka (JP); Kohichi Tanaka, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 139 days.

(21) Appl. No.: 16/067,223

(22) PCT Filed: Jul. 22, 2016

(86) PCT No.: PCT/JP2016/071618
§ 371 (c)(1),
(2) Date: Jun. 29, 2018

(87) PCT Pub. No.: WO2017/115485
PCT Pub. Date: Jul. 6, 2017

(65) Prior Publication Data
US 2019/0027710 A1  Jan. 24, 2019

(30) Foreign Application Priority Data
Dec. 29, 2015  (JP) ................. 2015-257622

(51) Int. Cl.
*H01L 29/08*  (2006.01)
*H01L 51/56*  (2006.01)
(Continued)

(52) U.S. Cl.
CPC .............. *H01L 51/56* (2013.01); *B65H 29/56* (2013.01); *H01L 21/6715* (2013.01);
(Continued)

(58) Field of Classification Search
CPC ........... H01L 21/67132; H01L 21/6715; H01L 51/56; H01L 51/003; H01L 27/1218;
(Continued)

(56) References Cited

U.S. PATENT DOCUMENTS 6,391,220 B1 * 5/2002 Zhang .................... B32B 37/26
156/247
6,593,224 B1 * 7/2003 Lin ......................... H05K 3/205
438/618
(Continued)

FOREIGN PATENT DOCUMENTS

JP       2004260146 A    9/2004
JP       2009-78902 A    4/2009
(Continued)

*Primary Examiner* — Caleb E Henry
(74) *Attorney, Agent, or Firm* — ScienBiziP, P.C.

(57) ABSTRACT

A resin film is released from a supporting substrate without using light irradiation, with ease, and without damaging the resin film or the like. Preparation for separating the supporting substrate on which the resin film is cohesively formed into a first part and a second part; and at least one of the first part and the second part is allowed or caused to move in a direction parallel to an one surface of the first part while the first part of the supporting substrate and at least an edge of the second part facing the first part being moved with respect to one another, while a close contact between the resin film and an one surface of the second part of the supporting substrate being maintained, such that the first part and the edge of the second part are separated along a perpendicular direction to the one surface of the first part.

4 Claims, 12 Drawing Sheets

(51) Int. Cl.
  *H01L 21/67* (2006.01)
  *H01L 51/00* (2006.01)
  *H01L 27/12* (2006.01)
  *B65H 29/56* (2006.01)
  *H01L 27/32* (2006.01)
  *H01L 29/786* (2006.01)
  *H01L 51/52* (2006.01)

(52) U.S. Cl.
  CPC .... *H01L 21/67132* (2013.01); *H01L 27/1214* (2013.01); *H01L 27/1218* (2013.01); *H01L 27/1266* (2013.01); *H01L 27/3241* (2013.01); *H01L 29/78603* (2013.01); *H01L 51/003* (2013.01); *H01L 51/0097* (2013.01); *B65H 2301/44338* (2013.01); *B65H 2801/61* (2013.01); *H01L 51/5253* (2013.01)

(58) Field of Classification Search
  CPC ............ H01L 27/1266; H01L 27/1214; H01L 27/3241; H01L 29/78603; H01L 51/0097; H01L 51/5253; B65H 29/56; B65H 2801/61; B65H 2301/44338
  USPC .......................................................... 257/40
  See application file for complete search history.

(56) References Cited

U.S. PATENT DOCUMENTS

| | | | | |
|---|---|---|---|---|
| 7,540,079 | B2* | 6/2009 | Okuyama | H05K 3/007 29/830 |
| 8,043,936 | B2* | 10/2011 | Eguchi | H01L 21/67092 438/458 |
| 8,137,417 | B2* | 3/2012 | Eguchi | G02F 1/1303 29/25.01 |
| 8,247,261 | B2* | 8/2012 | Bedell | H01L 31/0725 438/73 |
| 9,040,420 | B2* | 5/2015 | Sugiyama | H01L 21/67132 438/670 |
| 9,333,736 | B2* | 5/2016 | Kumakura | H01L 51/56 |
| 9,437,832 | B2* | 9/2016 | Sakuishi | B32B 17/00 |
| 9,676,175 | B2* | 6/2017 | Adachi | B32B 37/22 |
| 9,937,698 | B2* | 4/2018 | Yasumoto | B32B 43/006 |
| 9,947,568 | B2* | 4/2018 | Yasumoto | H01L 21/67132 |
| 10,189,048 | B2* | 1/2019 | Yamazaki | H01L 51/003 |
| 10,259,207 | B2* | 4/2019 | Ohno | B32B 43/006 |
| 2005/0224978 | A1* | 10/2005 | Kawate | H01L 21/6836 257/753 |
| 2006/0131260 | A1* | 6/2006 | Okuyama | H05K 3/007 216/13 |
| 2010/0243159 | A1* | 9/2010 | Nishio | B29C 53/32 156/712 |
| 2011/0067808 | A1* | 3/2011 | Nishio | C09J 133/10 156/247 |
| 2011/0195248 | A1* | 8/2011 | Kiuchi | B32B 7/12 428/339 |
| 2012/0205030 | A1* | 8/2012 | Kiuchi | C09J 7/29 156/85 |
| 2013/0220511 | A1* | 8/2013 | Suzuki | B32B 37/12 156/60 |
| 2014/0319497 | A1* | 10/2014 | Cho | C08L 33/06 257/40 |
| 2015/0060933 | A1 | 3/2015 | Ohno et al. | |

FOREIGN PATENT DOCUMENTS

| | | |
|---|---|---|
| JP | 2015-38001 A | 2/2015 |
| JP | 2015-83504 A | 4/2015 |
| TW | I428243 B | 3/2014 |
| TW | 201521890 A | 6/2015 |
| WO | 2008/032625 A1 | 3/2008 |

* cited by examiner

METHOD FOR RELEASING RESIN FILM AND METHOD FOR MANUFACTURING ORGANIC EL DISPLAY DEVICE

TECHNICAL FIELD

The present invention relates to a method for releasing a resin film formed on a surface of a supporting board; a method for manufacturing an electronic device comprising a flexible substrate and a method for manufacturing an organic EL display device; and an apparatus for releasing resin film to release a resin film from the supporting board. More particularly, the present invention relates to a method for releasing a resin film; a method for manufacturing an electronic device comprising a flexible substrate and a method for manufacturing an organic EL display device; and an apparatus for releasing resin film, in which the supporting board is separated into a first part and a second part, and at least one of the first and second parts is moved so as to be spaced from each other, and thereby the resin film can be easily released without harmfully affecting an electronic element on the resin film.

BACKGROUND ART

In recent years, there has been a growing need for electronic devices each having an impact resistance and flexibility, and electronic devices in which electronic circuits including electronic elements are formed on a surface of a resin film which is frequently used. For example, such devices are applied to a variety of electronic devices including displays such as liquid crystal displays or organic EL display devices, solar batteries, and touch panels. In manufacture of these devices, electronic elements, for example, need to be formed on a flexible substrate, for example, a resin film, and however, if a part of the flexible substrate is lifted or curls, the flatness is degraded and the electronic elements cannot be formed in an accurate location. Thus, the electronic elements or the like are formed in a state in which the resin film is brought into intimate contact with a supporting board and are completed and thereafter the resin film is released from the supporting board. In this case, on the resin film, the electronic elements and circuits are formed, therefore, the resin film need to be released without stressing these elements and circuit. Therefore, conventionally, a method is used, in which adhesion between the resin film and the supporting board is made less strong by irradiation with laser beam or short-wavelength light emitted by a flash lamp and then the resin film is released.

However, if irradiation with laser beam is carried out, depending on the electronic elements formed on the resin film, features of the electronic elements may be degraded by the laser beam. Also, in order to release the resin film by irradiation with laser beam, a large, expensive irradiation apparatus is required. Accordingly, in an example disclosed in Patent Document 1, a resin film is formed on an adhesive layer which is formed only at a peripheral edge of a supporting board and all over the inside of the adhesive layer, electronic elements are formed on the resin film and thereafter only a part of the adhesive layer at the peripheral edge is irradiated with a laser beam, thereby, the resin film is separated and removed. That is, a central part is hardly adhered, and only the adhesive layer part at the peripheral edge is irradiated with laser beam, thereby, an adhesive force is weakened.

In addition, in the method described in Patent Document 2, a polyimide film which is formed via a photo-thermal conversion film made of metal such as molybdenum on a glass board is released by irradiation of light emitted by a flash lamp from a side of the glass board.

Further, in Patent Document 3, a separation layer is provided at a central part of a supporting board, and on the separation layer and the supporting board around the separation layer, a resin film is directly formed. The resin film is formed so that an adhesive force between the separation layer and the supporting board is greater than an adhesive force between the separation layer and the resin film. The resin film on the separation layer is released by being cut at a position on the end surface of the separation layer.

PRIOR ART DOCUMENT

Patent Document

Patent Document 1: JP 2013-135181 A
Patent Document 2: JP 2013-145808 A
Patent Document 3: JP 2013-168445 A

SUMMARY OF THE INVENTION

Problem to be Solved by the Invention

In the methods described in Patent Document 1 and Patent Document 2 each, a light source for light radiation is required, particularly, in the case of using laser beam, very expensive equipment is required. In addition, a large-scale maintenance is required and thus a large amount of maintenance costs also occur. Further, light source equipment stops while in maintenance and thus the backup equipment may be also required. Furthermore, in the method of Patent Document 1, an adhesive layer must be formed in a limited location of a peripheral edge part of a supporting board and thus it takes long to form the adhesive layer, and further, if an attempt is made to reuse the supporting board, a part coming into intimate contact with the supporting board at a peripheral edge of a resin film must be removed, thus causing higher costs. In the method of Patent Document 2 as well, formation of a photo-thermal conversion film irrelative to operation of an electronic device causes higher costs.

In addition, sequential light irradiation is applied to each part of the supporting board according to the irradiation range of the light source, the manufacturing costs increase and the productivity lowers. If a plurality of light source equipment is prepared to increase processing capability, a further larger amount of cost is required, and a large installation space is also required. Further, the supporting board is limited to the one having light transmissibility and thus there is a need to use a glass plate or the like which is comparatively hardly reused in place of a metal or the like which is inexpensive and suitable for reuse. The glass plate has a problem of being limited on reuse due to changing its color gradually owing to irradiation with laser beam or the like.

In the method of Patent Document 3, although light irradiation is not used, an adhesion strength of a separation layer with a resin film must be smaller than that with a supporting board, and therefore, there is a problem that it is difficult to select material and to make condition for forming film. In addition, the separation layer is formed only in a predetermined region and thus there is a problem that the process is complicated. Further, in a case where the separation layer is left in view of reuse of the supporting board, it is difficult to remove only the resin film of the peripheral edge.

As another method in which light irradiation is not used, for example, it is considered to insert a thin blade-shaped article into an interface between a resin film and a supporting board and to merely turn up the resin film from an end part. However, it is essentially within the scope of work with high difficulty to insert the blade into the interface between the resin film and the supporting board or to pinch the end part of the resin film in order to turn up the film. In addition, if the resin film formed at the predetermined adhesive strength is forcibly pulled for release, or alternatively, if the blade or the like is inserted into the interface, there is a risk that a resin film or electronic device is damaged.

The present invention has been made in order to solve the above-described problem, and an object of the present invention is to provide a method capable of easily releasing a resin film from a supporting board without using light irradiation requiring inexpensive light source equipment and without carrying out the complicated process of forming the adhesive layer or the separation layer at predetermined part and moreover without damaging the resin film or electronic elements.

Another object of the present invention is to provide a method for, using the method for releasing the resin film, manufacturing an electronic device particularly an organic EL display device.

A yet another object of the present invention is to provide an apparatus for releasing a resin film capable of releasing a resin film from a supporting substrate without using light irradiation and without damaging the resin film or electronic elements.

Means to Solve the Problem

A method for releasing a resin film according to the present invention is a method for releasing a resin film cohesively formed on an one surface of a supporting substrate from the supporting substrate, the method comprising: a step of preparing to separate the supporting substrate into a first part and a second part; and a step of allowing or causing at least one of the first part and the second part to move in a direction parallel to an one surface of the first part while moving the first part of the supporting substrate and at least an edge of the second part facing the first part with respect to one another, while maintaining a close contact between the resin film and an one surface of the second part of the supporting substrate, such that the first part and the edge of the second part are separated along a perpendicular direction to the one surface of the first part.

A method for manufacturing an electronic device having a flexible substrate according to the present invention comprises: a step of forming a flexible resin film on a surface of a supporting substrate, the supporting substrate comprising a first part and a second part; a step of forming an electronic element on the resin film; and a step of releasing the resin film with the electronic element from the supporting substrate, wherein the resin film is released by the method according to the method described above.

A method for manufacturing an organic EL display device according to the present invention is a method for manufacturing an organic EL display device comprising forming an organic EL element on a flexible substrate, the method comprising: forming the flexible substrate by baking a liquid resin applied onto a supporting substrate; forming the organic EL element in a matrix form on the flexible substrate, the organic EL element comprising TFT; forming a sealing member for sealing the organic EL element; preparing to separate the supporting substrate between a first part and a second part other than the first part, the first part including a part with the sealing member formed thereon; and a step of allowing or causing at least one of the first part and the second part to move in a direction parallel to an one surface of the first part while moving the first part of the supporting substrate and at least an edge of the second part facing the first part with respect to one another, while maintaining a close contact between the flexible substrate and an one surface of the second part of the supporting substrate, such that the first part and the edge of the second part are separated along a perpendicular direction to the one surface of the first part.

An apparatus for releasing a resin film according to the preset invention comprises: a pinching member for a second part of a supporting substrate to pinch the whole part in a widthwise direction of the second part, the supporting substrate having an one surface with a resin film cohesively formed thereon and comprising a first part and the second part; a holding member for the first part to hold the first part, the holding member restrictively movable in a direction perpendicular to an one surface of the first part and capable of moving in a direction parallel to the one surface of the first part and along a line between the first part and the second part; and a first driving part to separate the pinching member for the second part and the holding member for the first part from each other in the direction perpendicular to the one surface of the first part while maintaining parallelism between an edge of the second part facing the first part and the first part.

Effects of the Invention

According to a method for releasing a resin film of the present invention, a supporting substrate is separated into a first part and a second part, and an edge of the second part facing the first part is moved with respect to one another, while maintaining a close contact between the resin film and an one surface of the second part, such that the first part and the edge of the second part are separated along a perpendicular direction. Therefore, the resin film on the first part is released from the first part with the relative movement. That is, the resin film can be easily released without requiring light irradiation and without providing an adhesive layer and moreover without pinching an end part of the resin film. Also, in conjunction with the relative movement in the perpendicular direction, at least one of the first part and the second part is moved in a parallel direction, therefore, a stress to the resin film or electronic elements caused by the relative movement in the vertical direction can be reduced. That is, an expensive light source is not required and thus the manufacturing costs and the initial costs for the resin film can be reduced and moreover the resin film with high quality can be obtained.

According to a method for manufacturing an electronic device having a flexible substrate and a method for manufacturing an organic EL display device of the present invention, a flexible substrate on which organic EL elements or other electronic elements are formed can be easily released from a supporting substrate without using light irradiation and applying an excessive stress to the flexible substrate, the electronic elements, or organic EL elements. The electronic device and the organic EL display device both having electronic elements such as the organic EL elements with high electrical characteristics and having a flexible substrate can be manufactured at a low cost.

According to an apparatus for releasing a resin film of the present invention, a resin film on which electronic elements are formed can be released from a supporting substrate without applying an excessive stress to the resin film or electronic elements.

EMBODIMENT FOR CARRYING OUT THE INVENTION

Figure 1:
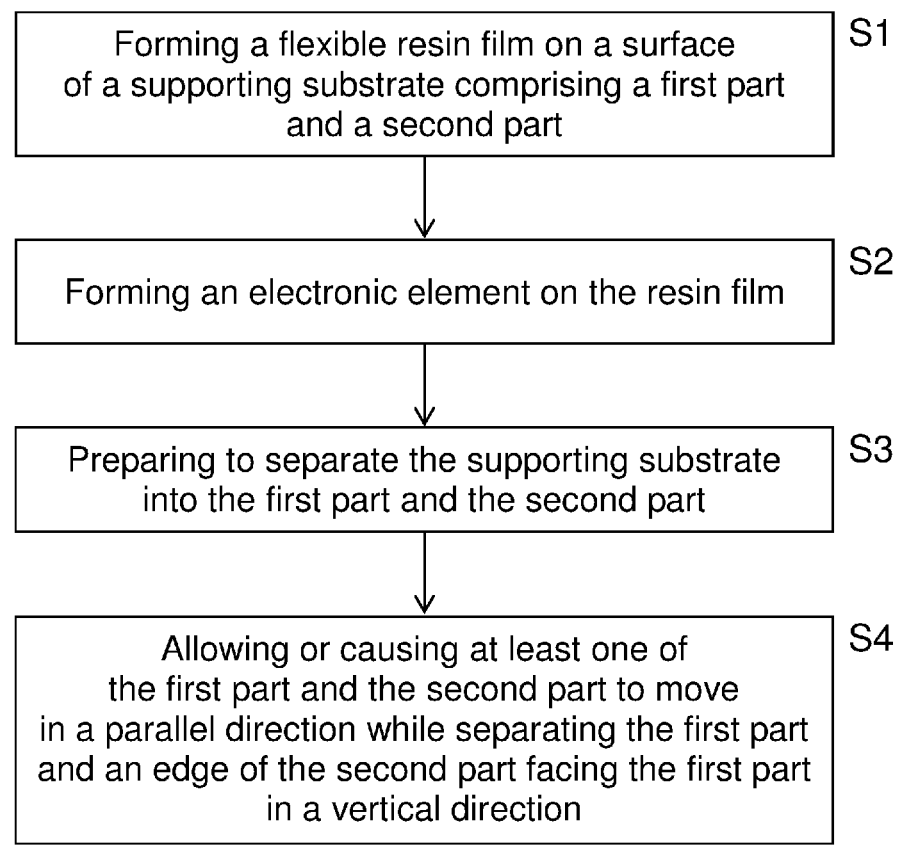
FIG. 1 is a flowchart showing a method for manufacturing an electronic device according to an embodiment including the step of releasing a resin film by a method for releasing a resin film according to an embodiment of the present invention.

Next, with reference to the drawings, a method for releasing a resin film of the present invention; a method for manufacturing an electronic device having a flexible substrate of the present invention; and a method for manufacturing an organic EL display device of the present invention will be described. In FIG. 1, there is shown a flowchart of a method for manufacturing an electronic device having a flexible substrate according to an embodiment of the present invention, including the steps of releasing a resin film in accordance with an embodiment of the method for releasing the resin film of the present invention. Also, in FIG. 2A to FIG. 2K, a state or the like of the resin film in each step is shown.

Figure 2A:
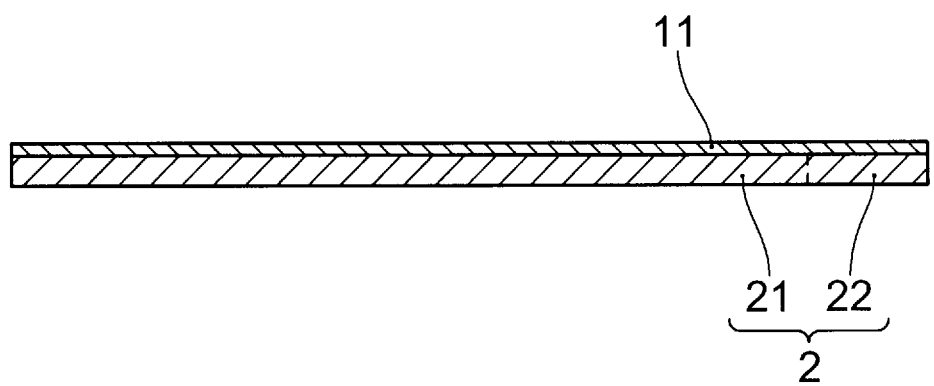
FIG. 2A shows a cross section after the step S1 of one example of the manufacturing method of FIG. 1.
Figure 2B:
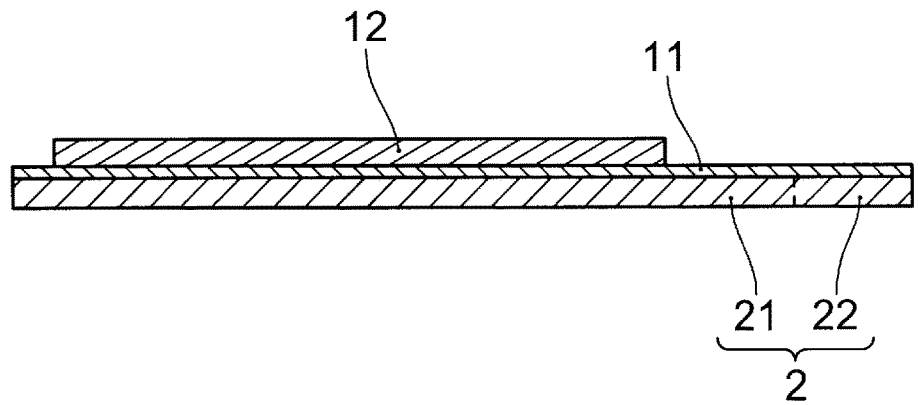
FIG. 2B shows a cross section after the step S2 of one example of the manufacturing method of FIG. 1.
Figure 2C:
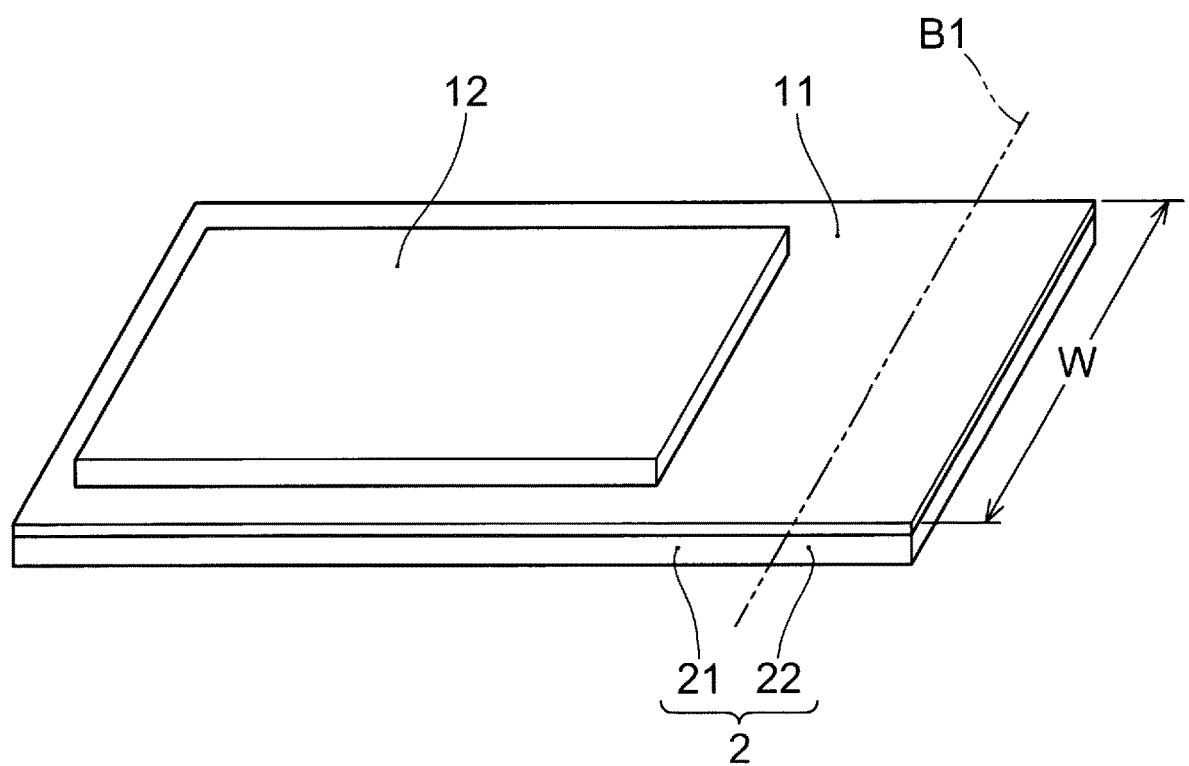
FIG. 2C is a perspective view showing a state after the step S2 of one example of the manufacturing method of FIG. 1.
Figure 2D:
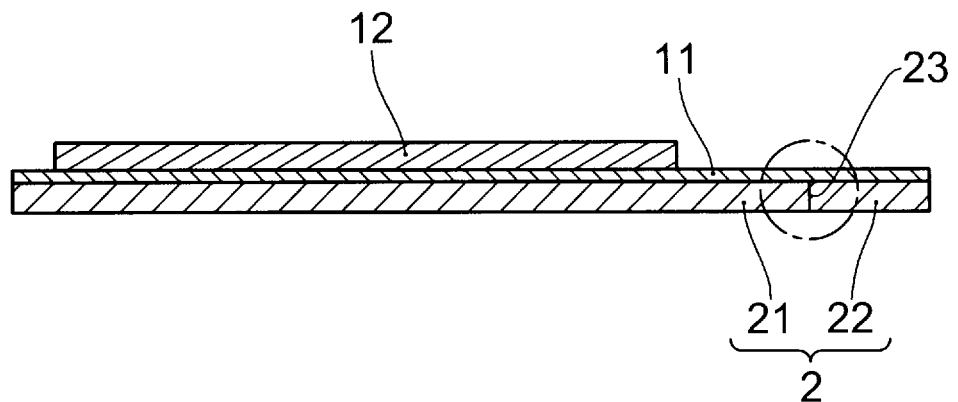
FIG. 2D shows a cross section in which a scribe line is provided in accordance with the step S3 of one example of the manufacturing method of FIG. 1.
Figure 2E:
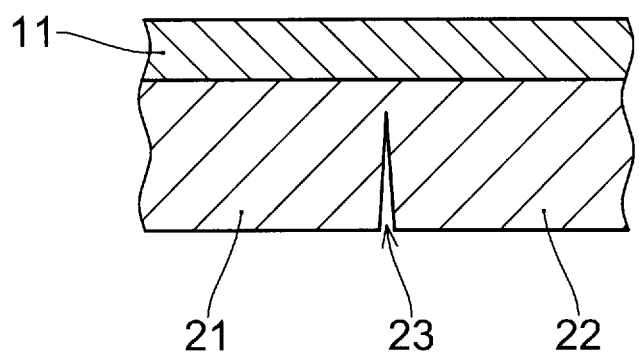
FIG. 2E is an enlarged view of the scribe line of FIG. 2D.
Figure 2F:
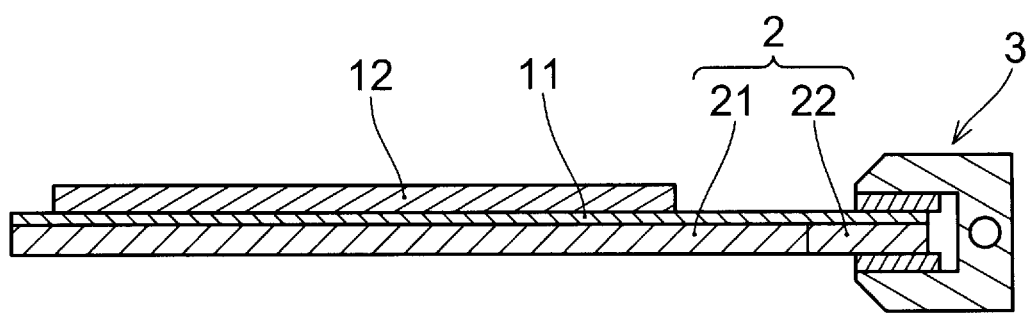
FIG. 2F shows an example in which a second part is pinched by a pinching member in accordance with the step S3 of one example of the manufacturing method of FIG. 1.
Figure 2G:
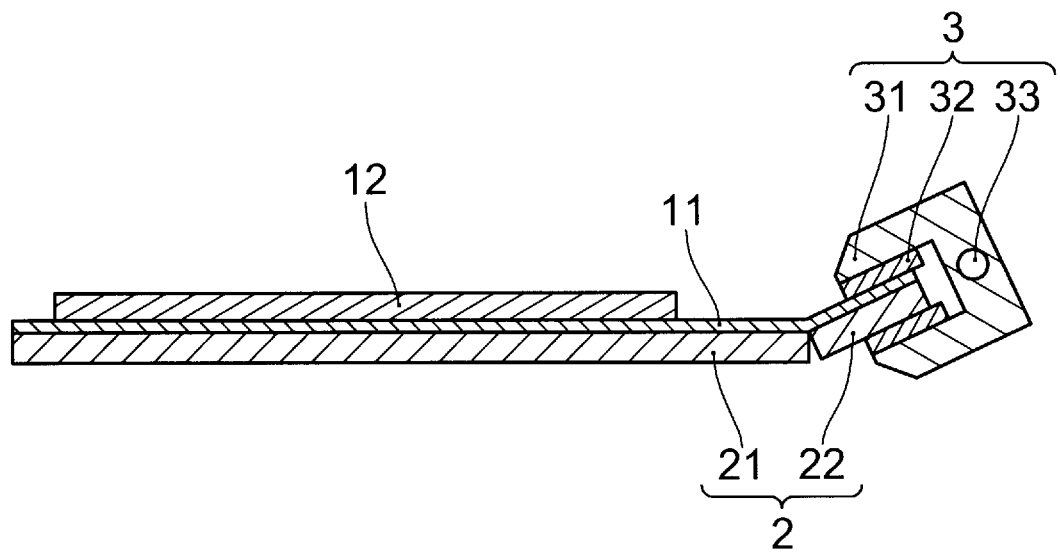
FIG. 2G shows a state in which a supporting substrate has been cut in accordance with the step S3 of one example of the manufacturing method of FIG. 1.

In the method for manufacturing the electronic device having the flexible substrate according to the present invention, as shown in FIG. 2A, a flexible resin film 11 is formed on a surface of a supporting substrate 2 having a first part 21 and a second part 22 (S1). Next, as shown in FIG. 2B and FIG. 2C, an electronic element 12 is formed on the resin film 11 (S2). In the present embodiment, the supporting substrate 2, in the steps of FIG. 2A to FIG. 2D, is not physically separated into the first part 21 and the second part 22 yet, and is established in an integrated state. Therefore, the terms "first part 21" and "second part 22", in this stage, respectively means parts which are to be a "first part 21" and a "second part 22". Next, as shown in FIG. 2D to FIG. 2G, the supporting substrate 2 is prepared to be separated into the first part 21 and the second part 22 (S3). The preparation for the separation means that the supporting member is made easily separable condition into the first part 21 and the second part 22. Afterwards, as shown in FIG. 2H to FIG. 2K, while maintaining a close contact between the resin film 11 and an one surface of the second part 22 of the supporting substrate 2, the first part 21 of the supporting substrate 2 and at least an edge 22 of the second part 22 facing the first part 21 are moved with respect to one another so as to be separated along a perpendicular direction to an one surface 21a of the first part 21 (the direction indicated with a reference "Ve" in each drawing, hereinafter, referred to as a "vertical direction Ve" or simply referred to as a "vertical direction"). In conjunction with the relative movement, at least one of the first part 21 and the second part 22 is allowed or caused to move in a direction parallel to the one surface 21a of the first part 21 and along a line between the first part 21 and the second part 22 (the direction indicated with reference "Pa" in each figure and hereinafter, referred to as a "parallel direction Pa" or simply referred to as a "parallel direction") (S4). Consequently, as shown in FIG. 2K, the resin film 11 is completely released from the first part 21 of the supporting substrate 2, and an electronic device 1 having the flexible substrate including the resin film 11 can be obtained.

The term "be allowed to move" means that when the first part 21 and the edge 22a of the second part 22 are relatively moved so as to be separated from each other in the vertical direction Ve, by way of action of a force in the parallel direction generated between the first part 21 and the second part 22 in accordance with the relative movement, one of or both of the first part and the second part are moved without being prevented from moving in the parallel direction Pa. For example, it is exemplified that at least one of the first part 21 and the second part 22 is supported by a supporting member or the like capable of freely moving in the parallel direction Pa and then the supporting member or the like is freely moved in the parallel direction Pa in conjunction with the relative movement between the first part 21 and the edge 22a of the second part 22 to be separated in the vertical direction. Also, the term "be caused to move" means that either one or both of the first part 21 and the second part 22 are moved by applying an external force which acts in the parallel direction apart from the free movement. For example, it is exemplified that at least one of the first part 21 and the second part 22 is moved in the parallel direction Pa by applying an external force to the supporting member or the like described above apart from the force that acts in the parallel direction by the relative movement between the first part 21 and the edge 22a of the second part 22 to be separated in the vertical direction Ve.

In addition, the term "relative movement" means that either one of two moving objects may be moved, and both of them may be moved in each direction different from one another unless particularly specified. Further, an expression "while maintaining a close contact between the resin film 11 and an one surface of the second part 22 of the supporting substrate 2" means that although it is preferable that the resin film 11 closely contacts with the surface from one end to the other end in the widthwise direction thereof, it is sufficient if the resin film 11 is held on the second part 22 in the widthwise direction to an extent such that a substantially even releasing force is applied to the resin film 11 from one end to the other end in the widthwise direction of the resin film 11 when the first part 21 and the second part 22 are separated. In that case, a part of the resin film 11 in the widthwise direction may be separated from the second part 22.

The step S3 and the step S4 of FIG. 1 show a method for releasing a resin film according to an embodiment of the present invention. Also, in a method for manufacturing an organic EL display device according to an embodiment of the present invention, a resin film to be formed in the step S1 of FIG. 1 can be a flexible substrate, and in the step S2, as an electronic element, an organic EL element including TFT (thin film transistor) is formed in a matrix form.

Figure 2H:
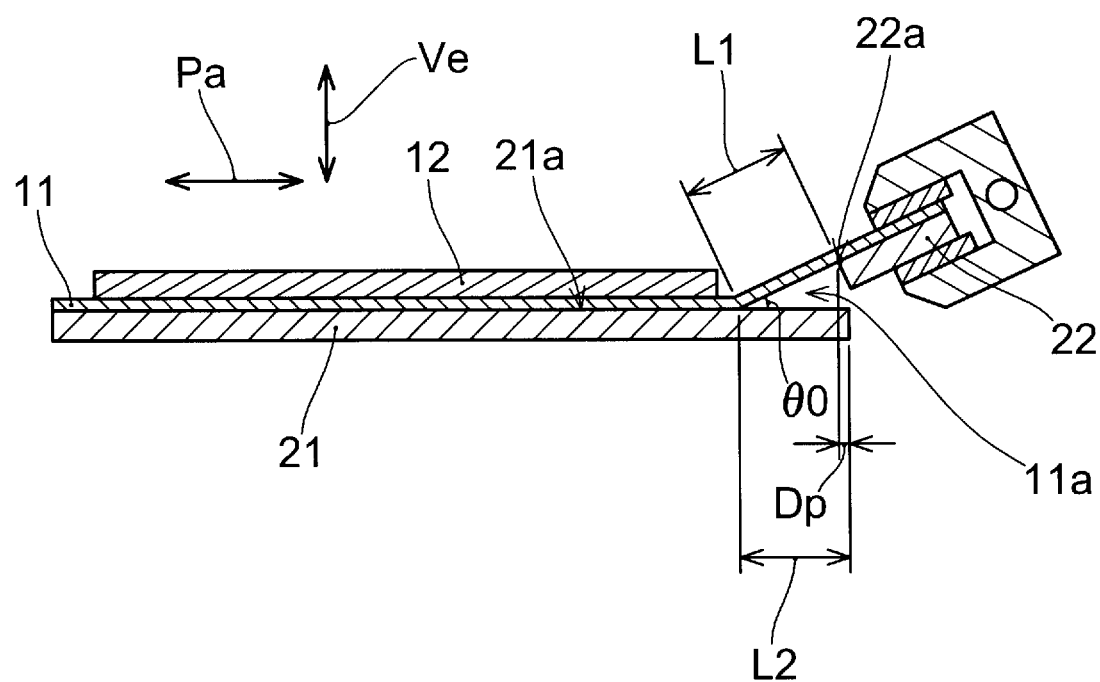
FIG. 2H shows a state in which a partial release of a resin film has occurred at an edge part of a first part in accordance with the step S4 of one example of the manufacturing method of FIG. 1.

According to the method for releasing the resin film according to the embodiment of the present invention, the first part 21 and the edge 22a of the second part 22 of the supporting substrate 2 are moved with respect to one another so as to be separated from one another in the vertical direction Ve, whereby the resin film 11 on the first part 21 is pulled towards the second part 22, and as shown in FIG. 2H, a partial separation 11a occurs with the resin film 11 at an edge of the first part 21 facing the second part 22. That is, a released part can be easily generated without pinching and pulling an end part of the resin film 11. A start point such as the separation 11a occurs, thereby making it possible to release another part of the resin film 11 on the first part 21 from the separation 11a with a comparatively weak force. Also, an end part on the side of the already released part of the resin film 11 is held on the second part 22 and thus, by separating the edge 22a of the second part 22 from the surface 21a of the first part 21, tension (releasing force) can be applied to an unreleased part of the resin film 11 substantially uniformly in the widthwise direction (which is a perpendicular direction to the direction along which the resin film 11 is to be released and is the depth direction, in FIG. 2H, which is perpendicular to the vertical direction Ve and to the parallel direction Pa). In this manner, the resin film 11 on the first part 21 can be gradually released easily from the first part 21 without forcibly pulling and damaging the resin film 11.

In addition, in the present embodiment, in conjunction with separating the first part 21 and the edge 22a of the second part 22 in the vertical direction Ve, at least one of the first part 21 and the second part 22 is allowed or caused to move in the parallel direction, therefore, a stress caused by a force applied to the resin film 11 and the electronic element 12 in conjunction with the separation in the vertical direction Ve can be further reduced. That is, according to the method for releasing the resin film of the present embodiment, the resin film 11 can be easily released from the supporting substrate 2 without causing degradation of characteristics of the electronic element and without damaging the resin film 11 or the electronic element 12. Expensive light source equipment is not required and thus the manufacturing costs of the resin film 11 can be reduced, also, the initial costs and the maintenance costs for manufacturing the resin film 11 can be remarkably reduced.

In addition, in a method for manufacturing an electronic device having a flexible substrate and a method for manufacturing an organic EL display device according to an embodiment of the present invention, a resin film (flexible substrate) is released from a supporting substrate using the method for releasing the resin film according to the embodiment of the present invention, therefore, the resin film can be released without using light irradiation and without applying an excessive stress to the flexible substrate, the electronic element, or the organic EL element. A method for releasing a resin film of the embodiment of the present invention will be described below in further detail.

First, referring to FIG. 2B to FIG. 2K, one example of a method for releasing a resin film of the present embodiment will be described. In the method for releasing the resin film of the present embodiment, a resin film 11 which is cohesively formed on an one surface of a supporting substrate 2 is released from the supporting substrate 2. In the example of FIG. 2B and FIG. 2C, an electronic element 12 is formed on the resin film 11. The material for the supporting substrate 2 is not limited in particular as long as it has rigidity capable of supporting the resin film 11 having flexibility to an extent such that there is no problem with the steps of forming the resin film 11 or the electronic element 12. For example, a glass plate, a ceramic substrate, a metal plate, and a semiconductor substrate or the like are exemplified. Particularly, in the method for releasing the resin film of the present embodiment, transparency is not required because light irradiation is not used. Here, the ceramic substrate, in a broad sense, generally designates a sintered body which is obtained by burning inorganic material to harden in a plate-like shape, and as a practical one, a substrate made of, for example, alumina ($Al_2O_3$) or sapphire which is one kind of alumina is exemplified. Also, a nitride semiconductor such as GaN is included in the semiconductor substrate. In a case where an organic EL element is formed on the resin film, at the time of forming TFT or the like, a heating process of the order of 500° C. is carried out and thus a glass plate or a ceramic substrate is preferable as the supporting substrate 2 from the viewpoint of thermal resistance or coefficient of thermal expansion, however, in the case of an electronic element that can be formed through a comparatively low temperature process, it is possible to use a metal plate or the like.

The resin film 11, for example, as described below, is formed by baking a liquid resin material applied on an one surface of the supporting substrate 2, and the adhesion strength between the resin film 11 and the supporting substrate 2 is important. Namely, when the first part 21 and the second part 22 described above are separated in the vertical direction, first, the resin film 11 is partially released from the first part 21. The force required for separating the first part 21 and the second part 22 depends on the adhesion strength between the resin film 11 and the supporting substrate 2. If the adhesion strength is too large, a large tension is required for releasing the resin film 11, and the film cannot be easily released and there is a risk that the electronic element 12 is adversely affected by the stress caused by this force. Alternatively, if the adhesion force is too small, there is a risk that the resin film 11 is released from the supporting substrate 2 in the manufacturing steps of, for example, forming the electronic element 12.

The inventors studied the durability in the manufacturing steps and easiness of release with 100 samples every adhesion strength while changing the adhesion strength variously. The result is shown in Table 1. In Table 1, double circle (◎) indicates "very good" (yield: 100%), single circle (o) indicates "good" (yield: 95% or more), and cross mark (x) indicates yield of less than 90%. In study of the durability in the manufacturing steps, a sample in which a release was observed at an edge of the resin film 11 during the steps was judged bad. In study of the easiness of release, judgement was made based on whether the characteristics of the TFT substrate for organic EL display device are good or not from the viewpoint of the fact that if the film cannot be easily released, an excessive stress is applied to the electronic element. Understanding from the result shown in Table 1 is that it is preferable to adjust the adhesion strength to 0.1 N/10 mm or more and 1.0 N/10 mm or less, more preferably 0.15 N/10 mm or more and 0.4N/10 mm or less, at the 90° peeling strength in the method of JIS Z 0237. A method for adjusting the adhesion strength of the resin film 11 will be described below. However, in the present embodiment, the adhesion strength of the resin film 11 is not limited to these values. In addition, the method for releasing the resin film of the present embodiment is applicable to the resin film that is separately formed in a film form and bonded on the supporting substrate 2.

adjusted on the coefficient of thermal expansion by baking condition and can be adjusted on the adhesion strength with the supporting substrate 2, therefore, it is possible to make it easy to release resin film 11 from the supporting substrate 2. As the material for the resin film 11, apart from polyimide, for example, transparent polyimide, PEN, PET, COP, COC, PC or the like can be used.

The electronic element 12 is appropriately formed according to an intended electronic device having a flexible substrate. A method for forming the electronic element 12 will be described below, focusing on an example of forming an organic EL element.

In the method for releasing the resin film of the present embodiment, first, preparation for separating the supporting substrate 2 into the first part 21 and the second part 22 is carried out. As shown in FIG. 2C, the supporting substrate 2 having a rectangular shape is separated into the first part 21 occupying a main region including the electronic element 12 and the second part 22 consisting of a region other than the first part 21 at a boundary B1 along an edge of the outer circumference in an outer circumferential part at which the electronic element 12 is not formed. Therefore, although in the present embodiment, the electronic element 12 is not formed on the second part 22, the boundary between the first part 21 and the second part 22 is not limited to the location shown in FIG. 2C, and as described below, the first part 21 and the second part 22 may have a same size, and the electronic element 12 may be formed on the second part 22.

In a case where a glass plate formed integrally is used for the supporting substrate 2, in the preparation for separating the supporting substrate 2 into the first part 21 and the second part 22, the supporting substrate (glass plate) 2 is cut. For example, first, as shown in FIG. 2D, the scribe line 23 is formed to the boundary part between the first part 21 and the second part 22 from a back surface of the supporting substrate 2 (an opposite surface to a surface on which the resin film 11 is formed). For example, by using a glass cutter having a blade tip made of an ultra-hard material or a material including a diamond, as shown in FIG. 2E, a groove-shaped scribe line 23 is formed. It is preferable to form the scribe line 23 as deeply as possible in the thickness direction of the glass plate 2 using a highly permeable glass cutter so that cutting of the glass plate 2 is made easy. For example, if the glass plate has a thickness of the order of 0.5 mm, it is preferable to form the scribe line 23 up to a depth of 50% or more and 90% or less of the thickness of the glass plate. However, if there is no risk that the blade tip of the glass cutter or the like gets into the resin film 11, the scribe

TABLE 1

| | Adhesion strength (N/10 mm) | | | | | | | | | | | | | |
|---|---|---|---|---|---|---|---|---|---|---|---|---|---|---|
| | 0.05 | 0.1 | 0.15 | 0.2 | 0.3 | 0.4 | 0.5 | 0.6 | 0.7 | 0.8 | 0.9 | 1.0 | 1.1 | 1.2 |
| Durability in manufacturing steps | X | ○ | ◎ | ◎ | ◎ | ◎ | ◎ | ◎ | ◎ | ◎ | ◎ | ◎ | ◎ | ◎ |
| Easiness of release | ◎ | ◎ | ◎ | ◎ | ◎ | ◎ | ○ | ○ | ○ | ○ | ○ | ○ | X | X |

Figure 3A:
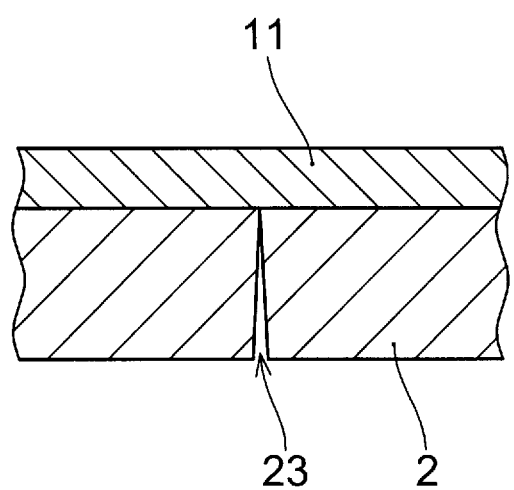
FIG. 3A shows another example of the scribe line of FIG. 2E.
Figure 3B:
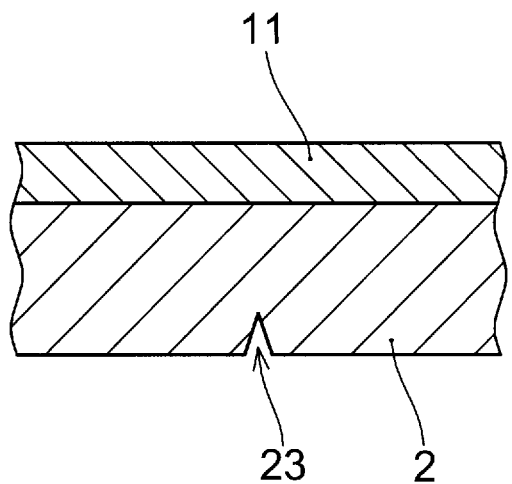
FIG. 3B shows yet another example of the scribe line of FIG. 2E.

A material for the resin film 11 needs to be a material which is durable at a temperature 500° C. for example, in a case where the electronic element 12 that is formed on the resin film 11 includes TFT or the like. In addition, it is preferable that the coefficient of thermal expansion is as close to that of the supporting substrate 2 as possible. From this point of view, polyimide is preferable. Polyimide can be line 23 may be formed so as to penetrate the glass plate 2 (refer to FIG. 3A). Conversely, in a case where the resin film 11 is adversely affected, as long as the glass plate can be cut, the scribe line may be formed up to a depth of less than 50% of the thickness of the glass plate 2 so as not to reach the resin film 11 even if the permeability in the thickness direction varies (refer to FIG. 3B).

Next, the glass plate 2 is cut along the scribe line 23. For example, as shown in FIG. 2F, the second part 22 and the resin film 11 are pinched by the pinching member 3 so that the resin film 11 on the second part 22 is held on an one surface of the second part 22, and as shown in FIG. 2G, the second part 22 is tilted with respect to the first part 21 such that an opening of the groove-shaped scribe line 23 broadens. For example, the pinching member 3 may be moved such that the opening of the scribe line 23 broadens while the first part 21 is fixed, or the force in a direction of pressing from the side of the resin film 11 towards the scribe line 23 may be applied to the boundary part between the first part 21 and the second part 22. In this manner, the supporting substrate 2 is cut and separated into the first part 21 and the second part 22, and the preparation for separating the supporting substrate 2 into the first part 21 and the second part 22 completes. The preparation for separating the substrate into the first part 21 and the second part 22 may be carried out subsequently to forming the resin film 11 or prior to forming the electronic element 12. In a case where a substrate made of a comparatively hard and low toughness material such as a ceramic substrate or a semiconductor substrate is used as the supporting substrate 2, preparation for separating can be also carried out by the method illustrated in FIG. 2D and FIG. 2E.

The pinching member 3 preferably has a pinching part 31 that pinches the whole part in a widthwise direction of the second part 22 of the supporting substrate 2 and the resin film 11 via a buffer part 32, and the pinching part 31 is fixed to a driving part which can be moved upward and downward, which is not shown. This upward and downward movement may be a movement along a vertical direction or may be a movement in an oblique direction. That is, it is sufficient as long as the movement includes a component in the vertical direction. The pinching member 3 is also formed so as to be able to rotate the pinching part 31 about a supporting shaft 33. Consequently, the second part 22 pinched by the pinching part 31 can rotate about the supporting shaft 33.

Next, as shown in FIG. 2H to FIG. 2K, the resin film 11 is gradually released from an one surface 21a of the first part 21. In the present embodiment, first, as shown in FIG. 2H, the first part 21 and the edge 22a of the second part 22 are moved with respect to one another while maintaining a close contact between the resin film 11 and an one surface of the second part 22, and the one surface 21a of the first part 21 and the edge 22a of the second part 22 are separated at a predetermined distance. In the example shown in FIG. 2H, either one or both of the first part 21 and the second part 22 are moved along a direction in which these two parts are separated along the vertical direction Ve. In this manner, a partial release 11a occurs with the resin film 11 on the first part 21 in the vicinity of the boundary with the second part 22. In addition, the second part 22 tilts with respect to the first part 21 by $\theta_0$. The already released part of the resin film 11 tenses without bending or slackening from the second part 22 to the first part 21 and thus, as in the second part 22, this released part forms an angle of $\theta_0$ relative to the one surface 21a of the first part 21.

The first part 21 and the second part 22 are moved with respect to one another in a direction in which these two parts overlap in a plan view in the parallel direction Pa. Preferably, the first part 21 and/or the second pat 22 are/is allowed or caused to move so that stretching or slackness does not occur with the already released part of the resin film 11. For example, the first part 21 and/or the second part 22 are/is moved with respect to one another along the parallel direction Pa by a distance $D_p$ according to a distance of relative movement in the vertical direction Ve, so that a length L1 of the already released part of the resin film 11 and a length L2 of a part of the first part 21 exposed by the release of the resin film 11 are equal to each other. By such free movement or forcible movement, the stress to the resin film 11 by the relative movement in the vertical direction Ve of the first part 21 and the second part 22 is reduced.

Figure 2I:
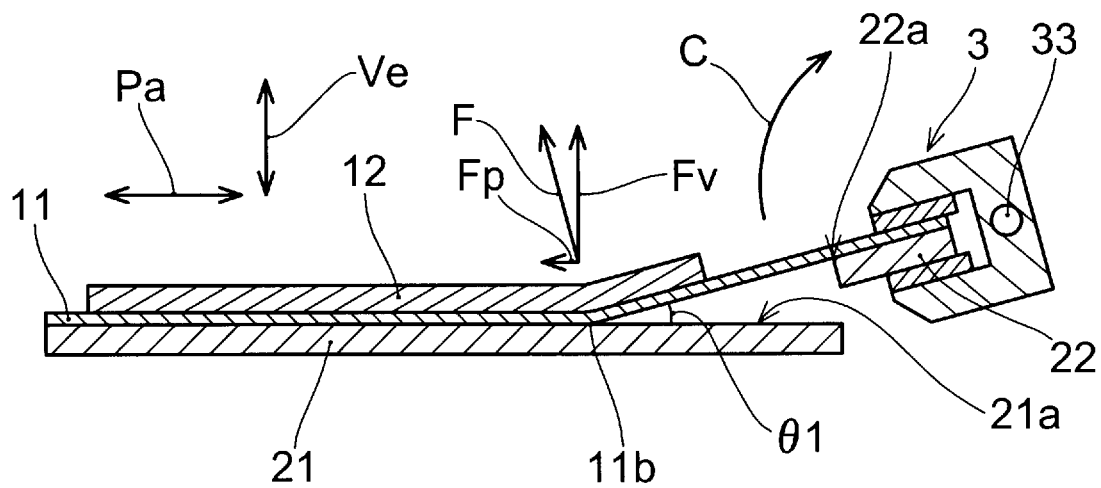
FIG. 2I shows a state in which the first part and an edge of a second part have moved with respect to one another from the state of FIG. 2H.
Figure 2J:
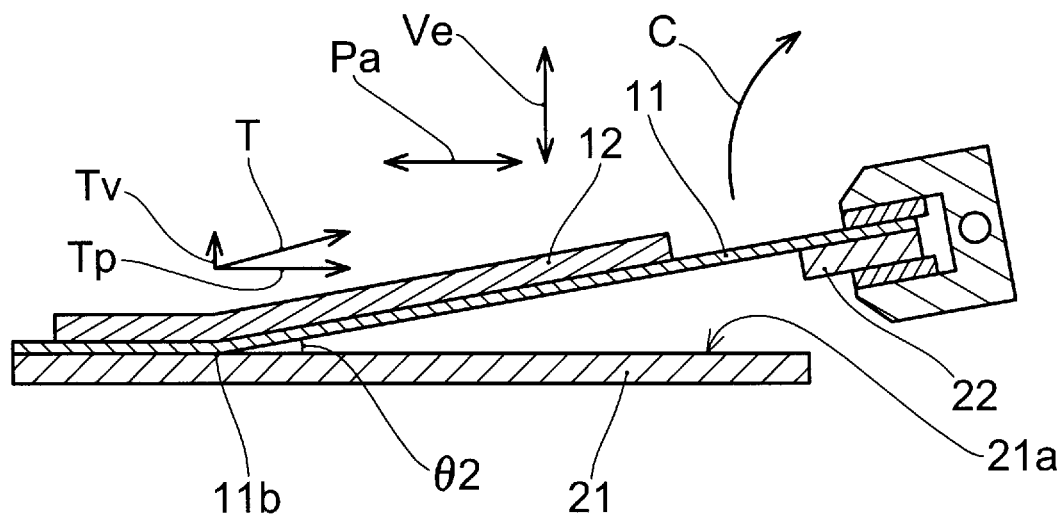
FIG. 2J shows a state in which the first part and the edge of the second part have further moved with respect to one another from the state of FIG. 2I.
Figure 2K:
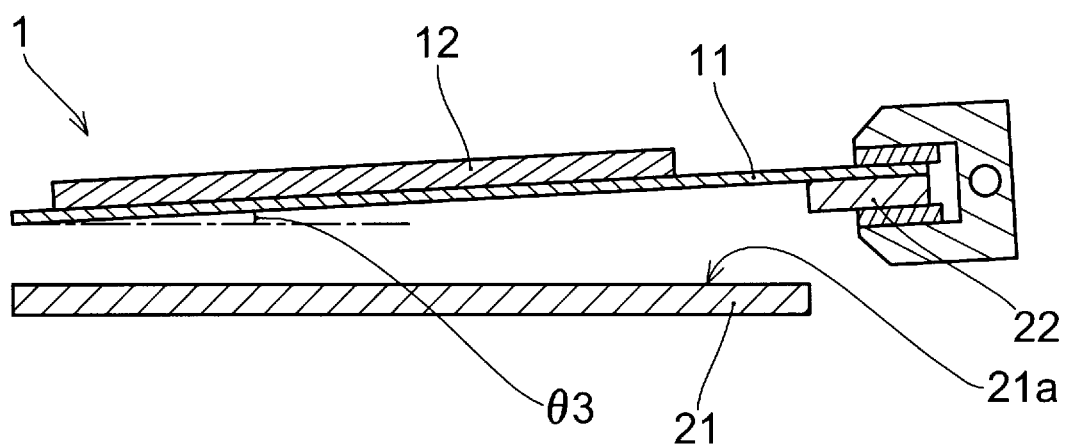
FIG. 2K shows a state in which the first part and the edge of the second part have further moved with respect to one another from the state of FIG. 2J, and a resin film has been completely released from the first part.

Subsequently, as shown in FIG. 2I to FIG. 2K, in a state in which the resin film 11 comes into contact with the one surface of the second part 22, the first part 21 and the edge 22a of the second part 22 are gradually moved with respect to one another so that the first part 21 and the edge 22a of the second part 22 are further separated in the vertical direction Ve. In the example of FIG. 2I to FIG. 2K, this relative movement is gradually carried out by rotating the supporting shaft 33 of the pinching member 3. The supporting shaft 33 is parallel to the edge 22a of the second part 22 (parallel in the widthwise direction) and is provided opposite to the first part 21 relative to the edge 22a. By rotating the supporting shaft 33, the edge 22a of the second part 22 can be rotated about the supporting shaft 33, and in particular, by rotating the shaft in the direction indicated by reference C in the figures, the edge 22a of the second part 22 can be gradually separated from the one surface 21a of the first part 21 in the vertical direction Ve. In this manner, the resin film 11 on the first part 21 is pulled towards the second part 22, is gradually released from the one surface 21a of the first part 21, and finally is completely released from the first part 21, as shown in FIG. 2K.

In addition, with the rotation of the edge 22a of the second part 22, an angle of inclination of the second part 22 relative to the one surface 21a of the first part 21 decreases. In the example of FIG. 2I to FIG. 2K, the already released part, from the first part 21, of the resin film 11 tenses without bending or slackening between the one surface 21a of the first part 21 and the second part 22. Thus, the angle between the already released part of the resin film 11 and the one surface 21a of the first part 21 also gradually decreases from $\theta_0$ shown in FIG. 2H to $\theta_1$, $\theta_2$, and $\theta_3$ respectively shown in FIG. 2I to FIG. 2K sequentially in conjunction with rotational movement of the edge 22a of the second part 22.

In the steps shown in FIG. 2I to FIG. 2K also, at least one of the first part 21 and the second part 22 is allowed or caused to move in the parallel direction Pa while the one surface 21a of the first part 21 and the edge 22a of the second part 22 are relatively moved so as to be separated in the vertical direction Ve. That is, the edge 22a of the second part 22 and an end part of 11b of an unreleased part, from the first part 21, of the resin film 11 (hereinafter, simply referred to as an "end part 11b of the unreleased part") are freely moved or forcibly moved in a direction in which these two parts approach or separate from each other in a plan view. This action will be described referring to FIG. 2I and FIG. 2J.

When the one surface 21a of the first part 21 and the edge 22a of the second part 22 are separated in the vertical direction Ve, a tension T (refer to FIG. 2J) acts on the end part 11b of the unreleased part in the direction along the already released part of the resin film 11. The tension T can be decomposed into a parallel component Tp along the parallel direction Pa and a vertical component Tv along the vertical direction Ve according to an angle $\theta_2$ between the already released part of the resin film 11 and the one surface 21a of the first part 21. It is considered that the vertical component Tv mainly contributes to release of the resin film 11. Therefore, in virtue of moving at least one of the first part 21 and the second part 22 in the direction in which the edge 22a of the second part 22 and the end part 11b of the unreleased part approach each other in a plan view, the vertical component Tv can be appropriately maintained and the resin film 11 can be thereby released while the tension T is weakened and the stress to the resin film 11 is reduced.

In addition, in a case where the resin film 11 is comparatively hard, it is considered that the second part 22 rotates, and a force F (refer to FIG. 2I) thereby acts on the unreleased part 11b in a direction according to the direction of rotation of the second part 22. It is considered that in the early period of the release at which the length of the already released part of the resin film 11 still short and the angle θ1 between the part and to the one surface 21a of the first part 21 is large, the force F is comparatively large. And the force F can be also decomposed into the parallel component Fp and the vertical component Fv. Therefore, it is considered that when the force F is comparatively large, by moving at least one of the first part 21 and the second part 22 in a direction in which the edge 22a of the second part 22 and the end part 11b of the unreleased part are separated in a plan view, the stress to the resin film 11 can be reduced. However, as long as the stress to the resin film 11 or the electronic element 12 is not excessive, a release of the resin film may be furthered by moving at least one of the first part 21 and the second part 22 in a direction in which the tension T of FIG. 2J or the force F of FIG. 2I is strengthened.

After the resin film 11 has been completely released from the first part 21, the resin film 11 can be easily released from the edge 22a of the second pat 22 merely by clamping the released part, from the first part 21, of the resin film 11 and then releasing the second part 22 pinched by the pinching member 3. This is because a release has already occurred between the second part 22 and the resin film 11 through the releasing steps from the first part 21. Alternatively, in a case where a part of the resin 11 on the second part 22 is a mere marginal part, the resin film 11 may be cut in the vicinity of the edge 22a of the second part 22.

In the present embodiment, by rotating the second part 22, the one surface 21a of the first part 21 and the edge 22a of the second part 22 are gradually separated in the vertical direction Ve. Thus, a distance by which the first part 21 and/or the second part 22 are/is moved in the vertical direction Ve is reduced, and in connection with that, a movement distance along the parallel Pa is also reduced. Therefore, when a releasing apparatus of the resin film is fabricated, the apparatus can be made so as to have a comparatively small dimension which is appropriate to the size of the supporting substrate 2.

Figure 4A:
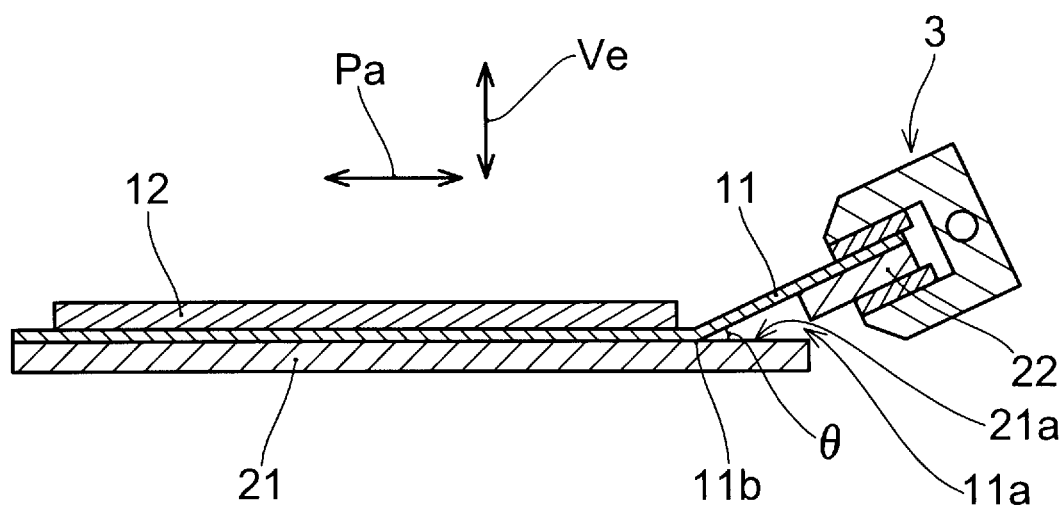
FIG. 4A shows a state in which a partial release of the resin film has occurred at the edge part of the first part in accordance with the step S4 of another example of the manufacturing method of FIG. 1.
Figure 4B:
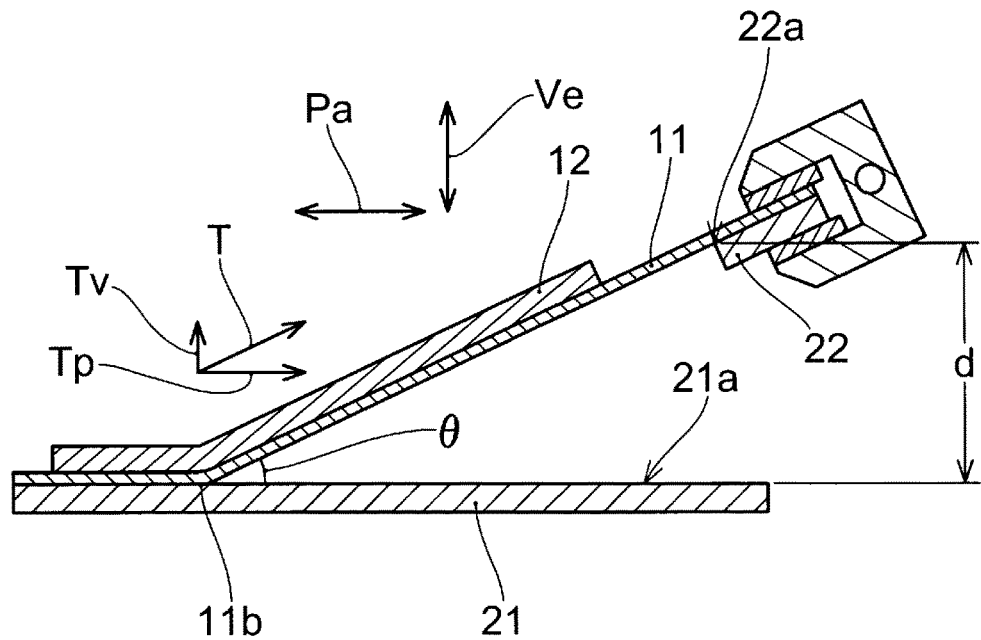
FIG. 4B shows a state in which the first part and the edge of the second part have moved with respect to one another from the state of FIG. 4A.
Figure 4C:
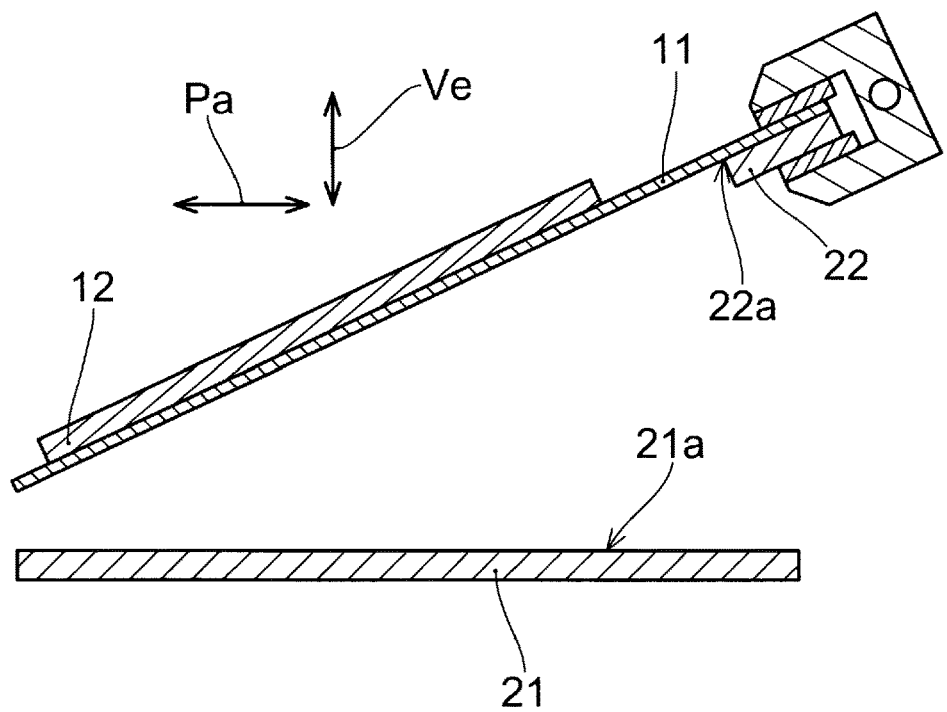
FIG. 4C shows a state in which the first part and the edge of the second part have further moved with respect to one another from the state of FIG. 4B, and the resin film has been completely released from the first part.

Next, another example of the method for releasing the resin film of the present embodiment will be described referring to FIG. 4A to FIG. 4C. The example shown in FIG. 4A to FIG. 4C are different from the example shown in FIG. 2A to FIG. 2K in that the first part 21 and the edge 22a of the second part 22 are separated in the vertical direction Ve, not by rotating the edge 22a, but by moving the end edge 22a and the one surface 21a of the first part 21 in the vertical direction Ve with respect to one another. In the following description, descriptive matters which are similar to those of FIG. 2A to FIG. 2K are omitted.

As shown in FIG. 4A, first, the steps that are similar to those of FIG. 2A to FIG. 2H are carried out to thereby cause a partial release 11a to occur with the resin film 11 on the first part 21. The second part 22 tilts with respect to the first part 21 by θ. The resin film 11 tenses without bending or slackening from the second part 22 to the first part 21 and thus the already released part, from the first part 21, of the resin film 11 forms an angle θ relative to the one surface 21a of the first part 21.

Subsequently, as shown in FIG. 4B, the first part 21 and the second part 22 are further gradually moved in a direction in which these parts are separated along the vertical direction Ve. In this manner, the one surface 21a of the first part 21 and the edge 22a of the second part 22 are gradually separated in the vertical direction Ve, and as shown in FIG. 4C, finally, the resin film 11 is completely released from the first part 21. The steps of FIG. 4A may be a part of a series of operation of relatively moving the first part 21 and the second part 22 from the state similar to that in FIG. 2I until the resin film 11 are completely released from the first part 21.

As shown in FIG. 4A to FIG. 4C, in the present example, at least one of the first part 21 and the second part 22 is allowed or caused to move in a direction in which the first part 21 and the second part 22 overlap in a plan view along the parallel direction Pa while the one surface 21a of the first part 21 and the edge 22a of the second part 22 are moved with respect to one another so as to be separated in the vertical direction Ve. That is, the edge 22a of the second part 22 and the end part 11b of the unreleased part of the resin film 11 are moved in a direction in which they approach each other in a plan view. In this manner, as in the description described above referring to FIG. 2J, the stress caused by the tension acting in connection with the separation between the one surface 21a of the first part 21 and the edge 22a of the second part 22 can be reduced.

In the example of FIG. 4A and FIG. 4B, the already released part, from the first part 21, of the resin film 11 tenses without slackening or bending between a part contacting closely with the first part 21 and the edge 22a of the second part 22, and an angle between the already released part and the one surface 21a of the first part 21 is maintained to be substantially constant by θ. The angle θ is appropriately selected so that the vertical component Tv and the parallel component Tp of the tension T (refer to FIG. 4B) has an appropriate strength according to the adhesion strength or tensile strength of the resin film 11. When the adhesion strength of the resin film 11 is adjusted to the value described above, the angle θ is of the order of 10° or more and 45° or less, and preferably is of the order of 15° or more and 30° or less. It is preferable to move at least one of the first part 21 and the second part 22 along the parallel direction Pa so that the angle θ is maintained to be constant. Specifically, it is preferable to move at least one of the first part 21 and the second part 22 distance of d*tan (θ/2) in the parallel direction Pa for every distance of separation d in vertical direction Ve. However, as in the example of FIG. 4A to FIG. 4C, even when the one surface 21a of the first part 21 and the edge 22a of the second part 22 are moved with respect to one another in the vertical direction Ve, the angle between the released part of the resin film 11 and the one surface 21a of the first part 21 may be changed.

In another example of the present invention shown in FIG. 4A to FIG. 4C, the one surface 21a of the first part 21 and the edge 22a of the second part 22 are separated in the vertical direction by way of relative movement in the vertical direction between the first part 21 and the second part 22, that is a similar operation to the step shown in FIG. 2H, unlike the one example of the present embodiment mentioned above in which the second part 22 is rotated. Thus, when a releasing apparatus of the resin film 11 is fabricated, the apparatus can be configured with a simple structure.

Although in the one and the another examples of the present embodiment described above, the surface 21a of the first part 21 and the edge 22a of the second part 22 are separated in the vertical direction by way of rotational movement of the edge 22a of the second part 22 or linear movement of the edge 22a in the vertical direction, the present embodiment is not limited thereto as long as the movement has a component in the vertical direction. For example, the movement may be a movement in an oblique direction, for example. In addition, as mentioned above, the first part 21 may be moved in the vertical direction, and for example, in a case where the second part 22 is located upward relative to the first part 21, the first part 21 may be lowered by its own weight.

In the present embodiment, a part of the resin film 11 facing the second part 22 is held, by the second part 22, at the whole part in width W (refer to FIG. 2C) in a direction along a boundary line between the first part 21 and the second part 22. Thus, in the steps shown in FIG. 2H and FIG. 4A, it is possible to make a force for releasing the resin film 11 act substantially uniformly over the whole part in width W of the resin film 11, and it is possible to make a partial release 11a occur at the whole part in the width W. Further, since the resin film 11 is held in such way by the second part 22 and the partial release 11a over the whole part in width W occurs, in the steps shown in FIG. 2I to FIG. 2K and FIG. 4B and FIG. 4C, it is possible to make a force in the releasing direction act substantially uniformly over the whole part in width W of the resin film 11. In a case where there is a part which is not held, such part is prone to become an obstacle to the release because, even if released, the part attempts to adhere onto the first part 21 owing to resilience on shape that the resin film 11 has, however, such case does not occur. In addition, it is possible to prevent a stress from concentrating on a certain part in the direction of the width W of the resin film 11. Therefore, the resin film 11 can be easily released with a less stress. In this point of view, in the steps shown in FIG. 2H to FIG. 2K and FIG. 4A to FIG. 4C, it is preferable to move the first part 21 and/or the second part 22 while the edge 22a of the second part 22 and the end part 11b of the unreleased part of the resin film 11 are maintained in a substantially parallel state.

Although in the examples described above, the resin film 11 is formed on the whole one surface of the supporting substrate 2, anything is not limited by those example, and a marginal part on which the resin film 11 is not formed may be present at an outer circumferential part of the supporting substrate 2. By doing so, in a period of time after forming the resin film 11 until releasing the resin film 11, the end part of the resin film 11 is prevented from being unintentionally turned up by handling or the like. In such a case, when the resin film 11 is released, it is more difficult to release the film from the end part thereof mechanically in accordance with the conventional art. However, in the present embodiment, the resin film is released using the boundary part between the first part 21 and the second part of the supporting substrate 2 as a start point, therefore, the resin film 11 can be easily released.

Figure 5:
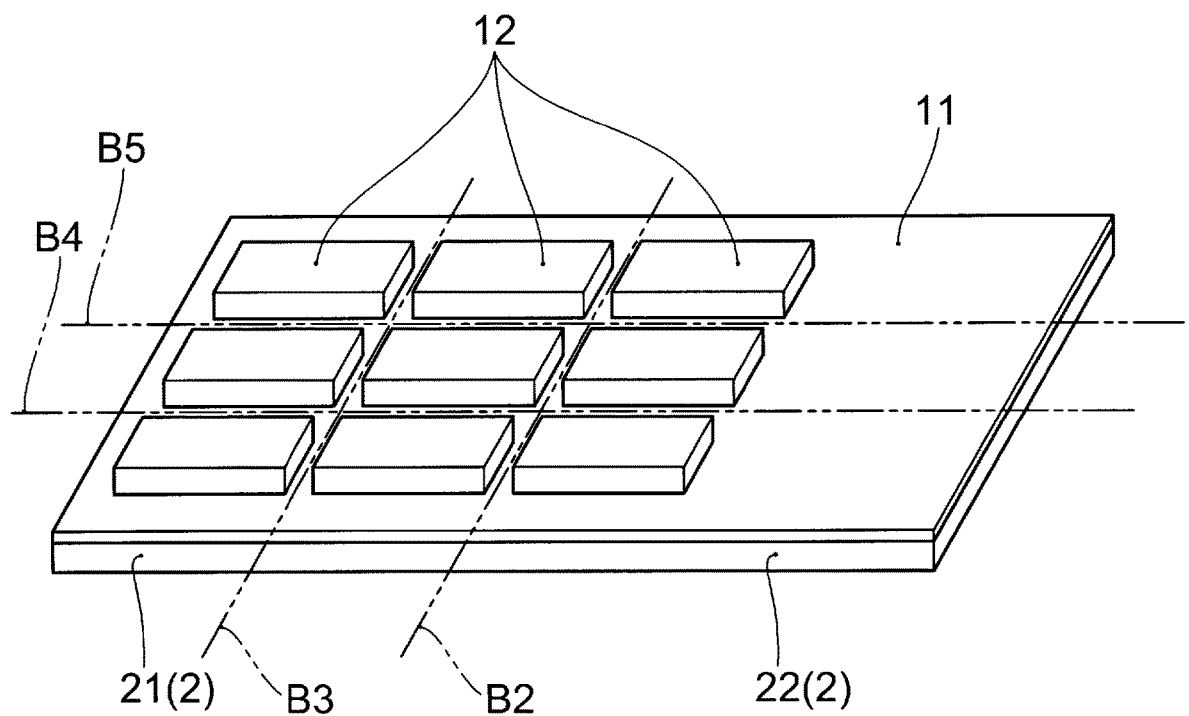
FIG. 5 shows an example in which electronic elements are formed in a plurality of regions in the manufacturing method of FIG. 1.

In addition, although in the examples described above, the electronic element 12 is formed in one region, as shown in FIG. 5 the electronic element 12 may be formed in a plurality of regions on the resin film 11. In a case where the electronic element 12 is formed in the plurality of regions, the first part 21 and the second part 22 may be separated on boundaries B2, B3 between the regions in which the electronic element 12 is formed. In that case, after the resin film 11 has been released, both of the first part 21 and the second part 22 can have a size enough to be utilized as a supporting substrate again. Thus, the first part 21 and the second part 22 can be reused as they are, without carrying out the steps of reproducing the supporting substrate 2 into the state before separated. Particularly, in a case where the first part 21 and the second part 22 are separated at the center of the supporting substrate 2, in a production line of an organic EL display device or the like, both of the first part 21 and the second part 22 can be reused as they are in a line for a supporting substrate of which size is half of that of the supporting substrate 2. In the method for releasing a resin film of the present embodiment, an easily reusable material can be used easily for the supporting substrate 2 because irradiation with laser beam is not carried out. This is particularly useful.

Figure 6A:
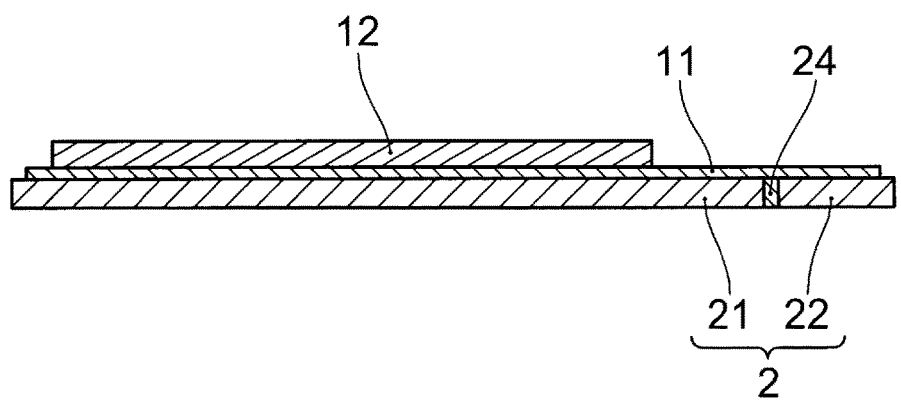
FIG. 6A shows another example of a supporting substrate in the manufacturing method of FIG. 1.
Figure 6B:
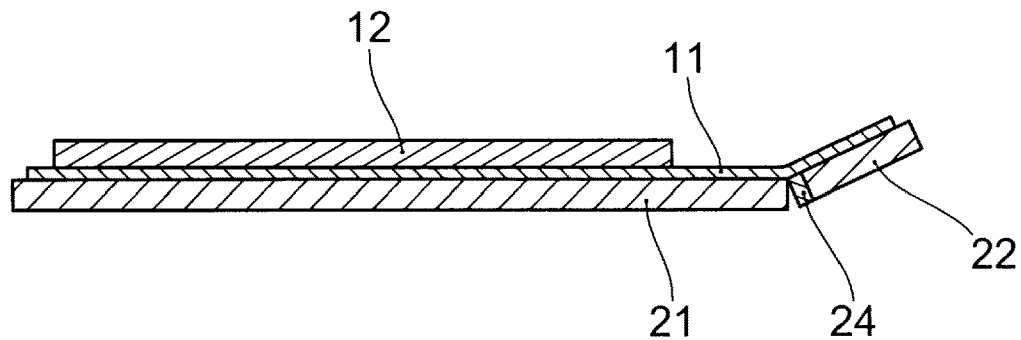
FIG. 6B shows a state after the preparation for separation of the supporting substrate in FIG. 6A.

Although in the above description, the step of preparation for separating the resin film into the first part 21 and the second part 22 including forming the scribe line 23 was described by way of example of the case in which the supporting substrate 2 is made of a glass plate, the supporting substrate 2 may be configured by removably connecting the first part 21 and the second part 22 to each other which are individually formed, by any attaching or detaching mechanism, for example, a fastening bracket or magnet. In FIG. 6A, an example of the case in which the first part 21 and the second part 22 are connected to each other by way of a magnet 24 is shown (in FIG. 6A, FIG. 6B, FIG. 7A, and FIG. 7B, the pinching member is omitted). In the present embodiment, light irradiation is not used and thus a metal or the like which does not transmit light can be used for the supporting substrate, and therefore, such a configuration can be used. In this case also, by selecting a magnet with appropriate magnetic property, as in the method described referring to FIG. 2G, the first part 21 and the second part 22 can be made separable from each other, that is, preparation for separation can be carried out (refer to FIG. 6B). In a case where a fastening bracket or the like is used, removing the fastening bracket is equivalent to preparation for separation. In the case of the supporting substrate 2 that is removably bonded, the first part 21 and the second art 22 can be reused as they are.

Figure 7A:
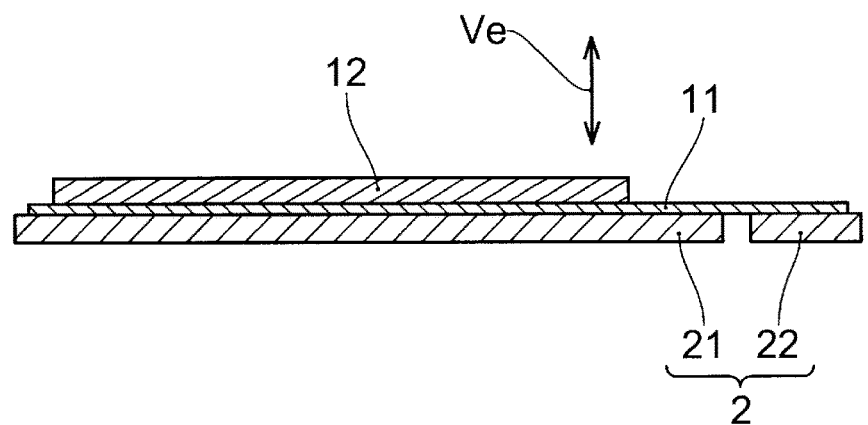
FIG. 7A shows another example of the step S3 of the manufacturing method of FIG. 1.
Figure 7B:
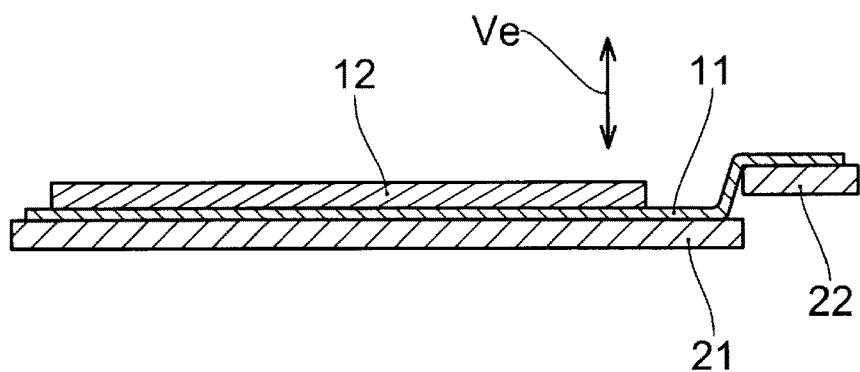
FIG. 7B shows another example of the step shown in FIG. 2H.

In addition, although in the example described referring to FIG. 2H, the second part 22 and the first part 21 are relatively moved in a state in which the second part tilts with respect to the first part 21, as shown in FIG. 7B, the first part 21 and the second part 22 may be relatively moved along the vertical direction Ve in the parallel state. When a releasing apparatus for the resin film is prepared, the number of parts to be rotated decreases, therefore, such apparatus can be realized with a simple structure. In order to relatively move the first part 21 and the second part 22 on which the resin film 11 is formed in the vertical direction Ve while maintaining a parallel state, as shown in FIG. 7A, a gap having a width almost the same as the thickness of the supporting substrate 2 is required between these parts at a time point of the completion of preparation for separating the supporting substrate into the first part 21 and the second part 22. For example, as in FIG. 6A described above, the first part 21 and the second part 22 are connected to each other via the magnet 24 to thereby constitute the supporting substrate 2 and then in preparation for separation, merely by removing the magnet 24 from a side opposite to the resin film 11, such a gap can be formed.

Next, a method for manufacturing an electronic device having a flexible substrate according to an embodiment of the present invention and steps other than the step of the separation in a method for manufacturing an organic EL display device according to an embodiment of the present invention will be further described.

Figure 8:
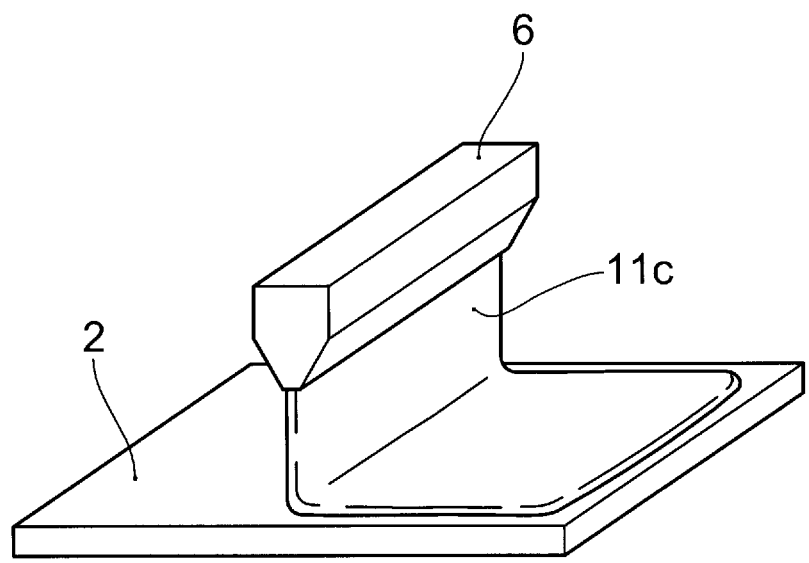
FIG. 8 shows an example of the step of applying a resin material.

First, as shown in FIG. 2A, a flexible resin film 11 to be a flexible substrate is formed on a surface of the supporting substrate 2 having the first part 21 and the second part 22. For example, the resin film 11 is formed by applying a resin material on the supporting substrate 2 and baking the resin material. Although any method for applying the resin material is acceptable as long as thickness of the resin film 11 can be controlled, as shown in FIG. 8 for example, the resin material can be applied using a slit coating method. That is, vanish (resin material) 11c which is a precursor of polyimide is supplied to a slot die 6 and then is discharged from the slot die 6, and vanish 11c is thereby applied. The application of the vanish 11c may be carried out by a method other than slit coating, and for example, in a case where the size of the supporting substrate 2 is small, a spin coating method is also effective in terms of adhesion or flatness of the resin film 11 although using efficiency is lower.

Subsequently, the resin material such as the applied vanish 11c is baked by the entire heating in a heating furnace or by heating from a back surface of the supporting substrate 2. For example, in a case where polyimide is used, the resin material is baked at a temperature of approximately 400° C. or more and 500° C. or less. As described above, adjustment by using the baking (prebaking and main baking) conditions is exemplified as one of the methods for adjusting the adhesive strength of the resin film 11 that is important in the present embodiment. If a temperature at the main baking increases, the adhesive strength increases, and if the time at the main baking is reduced, the adhesive strength decreases. In addition, the baking temperature affects coefficient of thermal expansion, and for example, if the temperature is increased up to nearly 500° C. and then the resin film is left for approximately 10 minutes or more and 60 minutes or less, coefficient of thermal expansion decreases, and coefficient of thermal expansion can also decrease when a temperature is maintained for 30 minutes or more after baking at the temperature of approximately 450° C. Conversely, if the rising step of temperature is increased and then time period for maintaining the raised temperature is extended, coefficient of thermal expansion can be increased. In these points of view, in baking of the resin film 11, it is preferable to increase a temperature up to the baking temperature while stepwise increasing the temperature of 10° C. or more and 200° C. or less every 5 to 120 minutes. This range can be further defined according to, for example, characteristics of the target resin film, or the resin material.

As another means in the method for adjusting the adhesion strength of the resin film 11, there are exemplified a method for changing a state of the surface of the supporting substrate 2 for the application prior to the application of the vanish 11c and a method for changing the adhesiveness by applying a so called surfactant such as silane coupling agent prior to the application of the vanish 11c. Specifically, the method for changing the state of the surface for the application itself can be carried out by changing the cleaning conditions and type for the supporting substrate 2 prior to the application of the vanish 11c. Among them, as the method for quantitatively and reproducibly controlling the adhesion strength, it is preferable to irradiate the surface for the application with UV having a wavelength of 254 nm while controlling power and time, at the end of cleaning for the supporting substrate 2. Regarding the irradiation energy for this irradiation, 1,000 mJ/cm$^2$ or more and 5,000 mJ/cm$^2$ or less is appropriate. Also, use of a surfactant such as a silane coupling agent generally make the adhesion strength increase, and by applying a fluorine coating agent or the like such as PTFE (polytetra fluoroethylene) onto the surface, the adhesion strength can be decreased. Although it is not intended in the present embodiment, the adhesion strength may be adjusted in combination with light irradiation. The adhesion strength of the resin film 11 may be adjusted by an appropriate method other than these methods, however, as described above, the adhesion strength is preferably adjusted so as to be 0.1 N/10 mm or more and 1.0 N/10 mm or less, and more preferably 0.15 N/10 mm or more and 0.4 N/10 mm or less at the 90° peeling strength in the method of JIS Z 0237.

Next, as shown in FIG. 2B, the electronic element 12 is formed. Although the electronic element 12 is schematically drawn in FIG. 2B, in a case where the electronic device is an organic EL display device for example, TFT and a laminate film composed by different organic layers which are layered so as to emit RGB light from each subsidiary pixel are formed. Wiring and the like for driving each pixel are also formed. In addition, if the electronic device is a touch panel, electrodes facing each other so as to form a capacitor between the two electrodes and wiring layers for the electrodes are formed. Further, if the electronic device is a liquid crystal display, an electrode is formed together with TFT on one of two glass substrates, and an electrode and a color filter is formed on the other one. Then, oriented films are laminated on the respective opposing surfaces and thereafter the substrates are disposed to face each other at predetermined intervals. A liquid crystal material is provided therebetween, and further, polarization plates are laminated on both outer surfaces. As a result, the liquid crystal display is completed. The electronic device to be manufactured by the manufacturing method of the present embodiment may be a variety of electronic devices having flexible substrate apart from these devices, for example, solar cells. Hereinafter, the steps of forming the electronic element 12 in a case where the electronic device is an organic EL display device having an organic EL element as the electronic device 12 will be described. The organic EL element itself formed by the manufacturing method of the present embodiment is the same as the conventional organic EL element, and a detailed description thereof is omitted.

Figure 9:
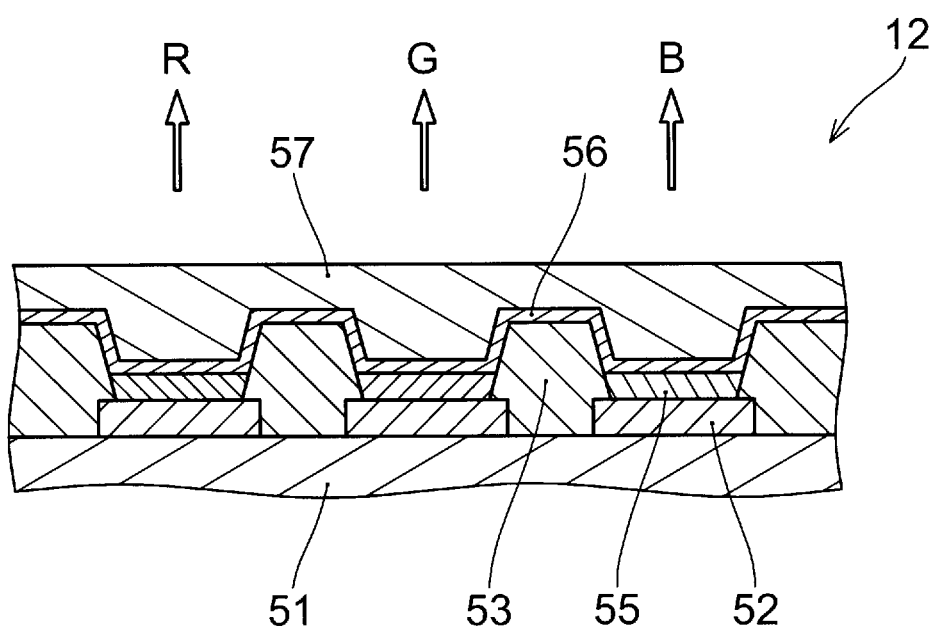
FIG. 9 shows a state in which an organic layer has been formed in each subsidiary pixel in a part of the steps of manufacturing an organic EL device.

A sectional view of a part of an organic EL display device to be manufactured by the manufacturing method of the present embodiment is shown in FIG. 9. On a flexible substrate made of the resin film 11 (refer to FIG. 2A), a switching element, for example, TFT not shown and wiring related thereto are formed for each subsidiary pixel, and a first electrode (for example, anode) 52 which is connected to the switching element is formed on a flattening layer 51 with a combination of a metal layer such as Ag and an ITO layer. An insulation bank 53 made of SiO$_2$ or the like is formed between the subsidiary pixels. In a region which is surrounded by the insulation bank 53, an organic layer 55 is vapor-deposited using a vapor deposition mask. The vapor deposition step is carried out for each subsidiary pixel or simultaneously as required.

In FIG. 9, the organic layer 55 is shown as one layer, however, the organic layer 55 is actually formed of a laminated film having a plurality of layers each consisting of different materials. For example, a hole injection layer and a hole transport layer are formed of an amine-based material or the like, and above these layers, a light emitting layer corresponding to RGB is formed of organic material, for example, Alga or DSA-based material in which an organic fluorescent material is doped. Further, on the light emitting layer, the electron transport layer is formed of Alga or the like, and an electron injection layer is appropriately formed of LiF or Liq or the like.

The no shown vapor deposition mask is removed and thereafter a second electrode (for example, cathode) 56 is formed on the whole surface using codeposition of, for example, Mg and Ag. Also, for example, Al may be used for the second electrode 56. On a surface of the second electrode 56, a protection layer 57 made of, for example, $Si_3N_4$ is formed. The entirety of them is sealed by a sealing layer made of, for example, a resin film not shown so as to have a construction in which the organic layer 55 and the second electrode 56 are prevented from absorbing moisture or oxygen or the like. In addition, the organic layer can be used as commonly as possible by using a structure in which the color filter is provided on a surface side of those. As a result of steps mentioned above, an organic EL element (electronic element 12) can be formed on the resin film 11.

Then, the resin film is released by the method for releasing the resin film according to the embodiment described above, thereby, an electronic device having a flexible substrate, in particular an organic EL display device can be obtained. In the method for releasing the resin film, the method for manufacturing the electronic device having the flexible substrate, and the method for manufacturing the organic EL display device of the present invention, any step other than the steps described with reference to the drawings may be added, and the sequential order of the steps may be changed as long as there is no problem in each step.

Figure 10:
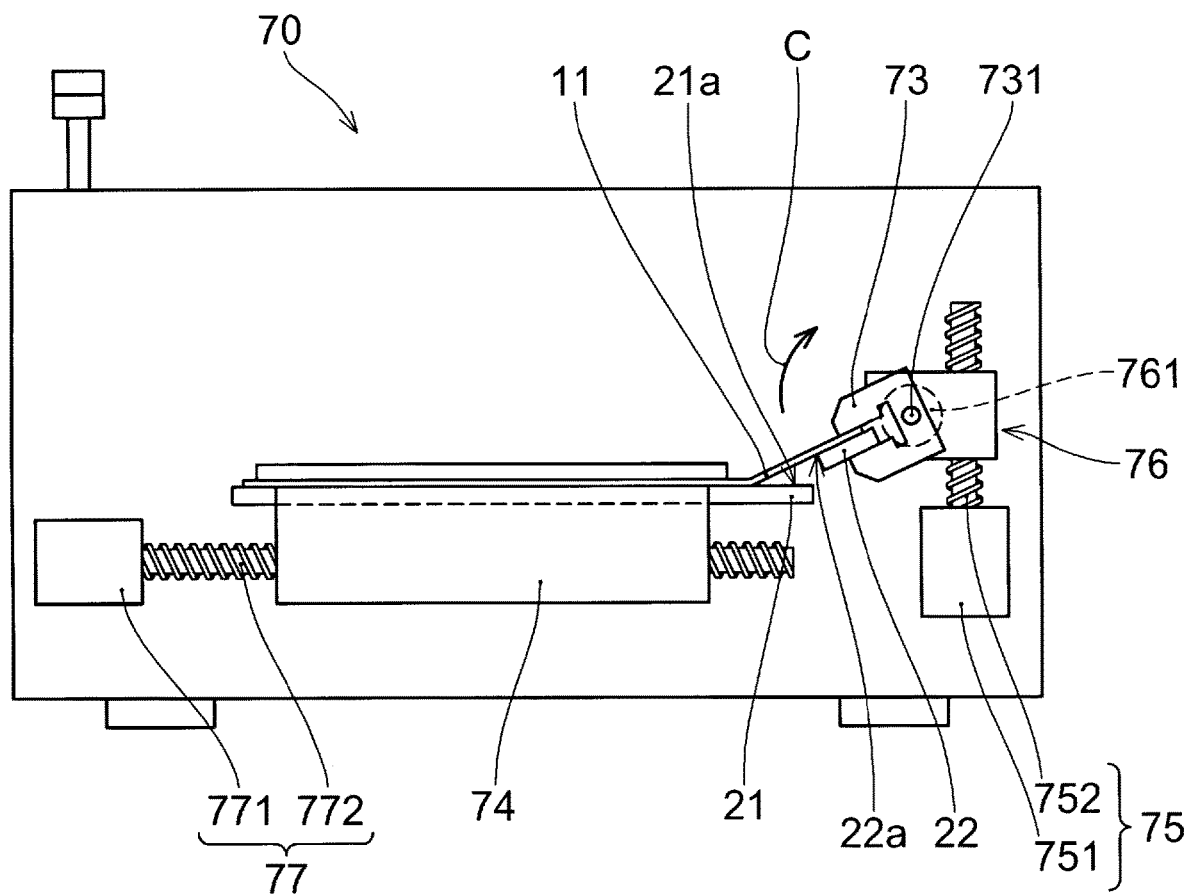
FIG. 10 shows an overview of an apparatus for releasing a resin film according to an embodiment of the present invention.

Next, an apparatus for releasing a resin film according to an embodiment of the present invention will be described with reference to the drawings. As an overview thereof is shown in FIG. 10, an apparatus 70 for releasing a resin film according to the embodiment comprises: a pinching member 73 for a second part of a supporting substrate 2 to pinch the whole part in a widthwise direction of the second part 22, the supporting substrate 2 having an one surface with a resin film 11 cohesively formed thereon and comprising a first part 21 and the second part 22; a holding member 74 for the first part to hold the first part 21, the holding member 74 restrictively movable in a direction perpendicular to an one surface 21a of the first part 21 and capable of moving in a direction parallel to the one surface 21a of the first part 21 and along a line between the first part 21 and the second part 22; and a first driving part 75 to separate the pinching member 73 for the second part and the holding member 74 for the first part from each other in the direction perpendicular to the one surface 21a of the first part 21 while maintaining parallelism between an edge 22a of the second part 22 facing the first part 21 and the first part 21. The pinching member 73 for the second part is configured in a similar manner to that of the pinching member 3 (refer to FIG. 2F) described in the one example of the method for releasing the resin film according to the embodiment described above, and moves the second part 22 according to the operation of the first driving part 75 while maintaining a close contact between the resin film 11 and the second part 22 of the supporting substrate 2. The holding member 74 for the first part holds the first part 21 using, for example, vacuum adsorption, and limits a movement of the first part 21 in the vertical direction. The first driving part 75 has a structure of so called ball screw, and a first driving shaft 752 rotates with operation of a driving source 751 consists of, for example, a motor, thereby the pinching member 73 for the second part moves in the vertical direction. In this manner, the one surface 21a of the first part 21 and the edge 22a of the second part 22 are moved with respect to one another in the vertical direction, and the one surface and the edge are separated each other in the vertical direction.

In the apparatus 70 for releasing the resin film, the pinching member 73 for the second part is further provided with a rotation driving part 76 to rotate the second part 22 about a supporting shaft 731 provided opposite to the first part 21 relative to the edge 22a in parallel with the edge 22a of the second part 22. The rotation driving part 76 rotates the supporting shaft 731 at least in the direction indicated with the reference C in FIG. 10 by operation of, for example, a motor 761. In this manner, the edge 22a of the second part 22 is rotationally moved in the direction in which the edge is separated from the one surface 21a of the first part 21, and the edge 22a and the one surface 21a of the first part 21 are separated from each other in the vertical direction.

In the example shown in FIG. 10, the holding member 74 for the first part comprises a second driving part 77 to move the first part 21, in accordance with an increase of a distance for separation of the second part 22 from the one surface 21a of the first part 21, in the parallel direction by a distance corresponding to the increase. The second driving part 77, in the similar way to the first driving part 75, rotates a second driving shaft 772 with operation of a driving source 771 consists of, for example, a motor and moves the holding member 74 for the first part in the parallel direction. This reduces a stress to the resin film 11, which can be caused in accordance with the separation between the one surface 21a of the first part 21 and the edge 22a of the second part 22 in the vertical direction.

FIG. 10 merely schematically shows a configuration of the apparatus 70 for releasing the resin film according to the embodiment of the present invention, and a specific structure of the apparatus for releasing the resin film of the present invention is not limited to the structure shown in FIG. 10.

DESCRIPTION OF REFERENCE NUMERAL

1 Electronic device
11 Resin film
11b End part of unreleased part
12 Electronic element
2 Supporting substrate (glass plate)
21 First part
21a One surface of First part
22 Second part
22a Edge of second part facing first part
23 Scribe line
3 Pinching member
33 Supporting shaft
51 Flattening layer
52 First electrode (anode)
53 Insulation bank
55 Organic layer
56 Second electrode (cathode)
57 Protection layer
6 Slot die
70 Apparatus for releasing a resin film
73 Pinching member for second part
74 Holding member for first part
75 First driving part
76 Rotation driving part
77 Second driving part
d Movement distance in vertical direction
Pa Parallel direction
Ve Vertical direction

What is claimed is:

1. A method for releasing a resin film cohesively formed on an one surface of a supporting substrate from the supporting substrate, the method comprising:

forming the resin film by baking a liquid resin applied onto the supporting substrate;

preparing to separate the supporting substrate into a first part and a second part; and allowing or causing at least one of the first part and the second part to move in a direction parallel to an one surface of the first part while moving the first part of the supporting substrate and at least an edge of the second part facing the first part with respect to one another, while maintaining a close contact between the resin film and an one surface of the second part, such that the first part and the edge of the second part are separated along a perpendicular direction to the one surface of the first part;

wherein the supporting substrate is made of a metal plate or a semiconductor substrate, the first part and the second part are removably connected to each other, and preparing to separate the supporting substrate is carried out by making the first part and the second part separable from each other;

wherein a separation between the first part and the edge of the second part along the perpendicular direction is performed by moving the edge of the second part and the one surface of the first part in the perpendicular direction;

wherein moving at least one of the first part and the second part in the direction parallel to the one surface of the first part corresponds to moving in a direction in which the first part and the second part overlap in a plan view;

wherein at least one of the first part and the second part is caused to move a distance of $d*\tan(\theta/2)$ in the direction parallel to the one surface of the first part for every distance of separation d in the perpendicular direction, provided that the $\theta$ is an angle between the resin film and the one surface of the first part, while the resin film tensing between a part of the resin film closely contacted with the first part and the edge of the second part, when the first part and the edge of the second part are separated along the perpendicular direction.

2. A method for manufacturing an organic EL display device comprising forming an organic EL element on a flexible substrate, the method comprising:

forming the flexible substrate by baking a liquid resin applied onto a supporting substrate;

forming the organic EL element in a matrix form on the flexible substrate, the organic EL element comprising TFT;

forming a sealing member for sealing the organic EL element;

preparing to separate the supporting substrate between a first part and a second part other than the first part, the first part including a part with the sealing member formed thereon; and a step of allowing or causing at least one of the first part and the second part to move in a direction parallel to an one surface of the first part while moving the first part of the supporting substrate and at least an edge of the second part facing the first part with respect to one another, while maintaining a close contact between the flexible substrate and an one surface of the second part of the supporting substrate, such that the first part and the edge of the second part are separated along a perpendicular direction to the one surface of the first part.

3. A method for releasing a resin film cohesively formed on an one surface of a supporting substrate from the supporting substrate, the method comprising:

forming the resin film by baking a liquid resin applied onto the supporting substrate;

preparing to separate the supporting substrate into a first part and a second part, wherein the first part and the second part are removably connected to each other, the resin film covers both the first part and the second part; and moving at least one of the first part and the second part in a direction parallel to the one surface of the first part while moving the first part and the second part with respect to one another in a direction perpendicular to the one surface of the first part to separate the first part from the second part, while maintaining a close contact between the resin film and the second part, such that the first part and the second part are separated from each other and the resin film is peeled from the first part.

4. The method for releasing the resin film according to claim 3, wherein preparing to separate the supporting substrate into the first part and the second part comprises forming a scribe line to a boundary between the first part and the second part and cutting the supporting substrate along the scribe line.

* * * * *